United States Patent
Sawamoto

(10) Patent No.: US 12,099,122 B2
(45) Date of Patent: Sep. 24, 2024

(54) RANGE IMAGE SENSOR AND RANGE IMAGE PICKUP DEVICE

(71) Applicant: Brookman Technology, Inc., Hamamatsu (JP)

(72) Inventor: Takehide Sawamoto, Hamamatsu (JP)

(73) Assignee: Brookman Technology, Inc., Hamamatsu (JP)

( * ) Notice: Subject to any disclaimer, the term of this patent is extended or adjusted under 35 U.S.C. 154(b) by 480 days.

(21) Appl. No.: 17/593,015

(22) PCT Filed: Mar. 8, 2019

(86) PCT No.: PCT/JP2019/009405
§ 371 (c)(1),
(2) Date: Sep. 3, 2021

(87) PCT Pub. No.: WO2020/183533
PCT Pub. Date: Sep. 17, 2020

(65) Prior Publication Data
US 2022/0179088 A1    Jun. 9, 2022

(51) Int. Cl.
*G01S 17/894* (2020.01)
*G01S 7/4861* (2020.01)
*G01S 7/4865* (2020.01)
*H01L 27/146* (2006.01)
*H04N 25/71* (2023.01)
*H04N 25/771* (2023.01)

(52) U.S. Cl.
CPC .......... *G01S 17/894* (2020.01); *G01S 7/4861* (2013.01); *G01S 7/4865* (2013.01); *H01L 27/14636* (2013.01); *H04N 25/745* (2023.01); *H04N 25/771* (2023.01)

(58) Field of Classification Search
CPC .... G01S 17/894; G01S 7/4861; G01S 7/4865; H04N 25/745; H04N 25/771
See application file for complete search history.

(56) References Cited

U.S. PATENT DOCUMENTS

2009/0303362 A1    12/2009  Ebihara
2013/0001429 A1     1/2013  Dowaki et al.
2016/0353045 A1*   12/2016  Kawahito ............. G01S 17/894
(Continued)

FOREIGN PATENT DOCUMENTS

CN      108307180        7/2018
JP      2009296400 A    12/2009
(Continued)

OTHER PUBLICATIONS

"International Application Serial No. PCT/JP2019/009405, International Search Report mailed Jun. 4, 2019", w/ English Translation, (Jun. 4, 2019), 5 pgs.
(Continued)

*Primary Examiner* — Thanh Luu
(74) *Attorney, Agent, or Firm* — Schwegman Lundberg & Woessner, P.A.

(57) ABSTRACT

One aspect of the present invention is a range image sensor wherein a pixel drive circuit supplies a storage drive signal which is shifted by a predetermined adjustment time between pixel circuits and stores an electric charge from a photoelectric conversion element in a charge storage portion in each pixel circuit.

13 Claims, 13 Drawing Sheets

(56) References Cited

U.S. PATENT DOCUMENTS

2018/0109741 A1 4/2018 Sukegawa et al.
2018/0313938 A1 11/2018 Okada

FOREIGN PATENT DOCUMENTS

| | | |
|---|---|---|
| JP | 2010268079 A | 11/2010 |
| JP | 2013012888 A | 1/2013 |
| JP | 2013137242 A | 7/2013 |
| WO | WO-2016170833 A1 | 10/2016 |
| WO | WO-2017126377 A1 | 7/2017 |

OTHER PUBLICATIONS

"International Application Serial No. PCT/JP2019/009405, Written Opinion mailed Jun. 4, 2019", (Jun. 4, 2019), 5 pgs.
"Chinese Application Serial No. 201980093557.5, Office Action dated Nov. 1, 2023", w English Translation, (Nov. 1, 2023), 24 pgs.

\* cited by examiner

RANGE IMAGE SENSOR AND RANGE IMAGE PICKUP DEVICE

PRIORITY APPLICATIONS

This application is a U.S. National Stage Filing under 35 U.S.C. § 371 from International Application No. PCT/JP2019/009405, filed on Mar. 8, 2019, and published as WO2020/183533 on Sep. 17, 2020; the benefit of priority of which is hereby claimed herein, and which application and publication are hereby incorporated herein by reference in its entirety.

TECHNICAL FIELD

The present invention relates to a range image sensor and a range image pickup device.

BACKGROUND ART

In the related art, a time of flight (hereinafter referred to as "TOF") type range sensor that measures a distance between a measuring instrument and a subject on the basis of a time of flight of light in a space (a measuring space) using the fact that the speed of light is known has been realized. A TOF type range sensor applies pulses of light (for example, infrared light) to a space to be measured (a measuring space) and measures a distance between a measuring instrument and a subject on the basis of a difference between a time at which the pulses of light are applied and a time at which the pulses of light (reflected light) reflected by the subject in the measuring space are returned, that is, a time of flight of light between the measuring instrument and the subject.

As a recent TOF type range sensor, similarly to a solid-state image pickup device that is mounted in an imaging device, a so-called range image pickup device in which light receiving circuits for detecting reflected light for measuring a distance are arranged at grid points of a two-dimensional grid (hereinafter simply referred to as "arranged in a grid shape") in units of pixels and which can acquire (capture) an image of a subject along with information of a distance between the subject and the imaging device (measuring instrument) has also been realized (for example, see Patent Literature 1).

When a distance to a subject is measured and electric charge (electric charge corresponding to a received light quantity) is acquired from light receiving circuits arranged in a grid shape, electric charge needs to be acquired by the light receiving circuits at the same timing in a global shutter system for distance measurement.

Accordingly, when a drive signal for reading electric charge from the light receiving circuits has a delay between the light receiving circuits, the reading timing may differ depending on the light receiving circuits.

As a result, when a distance between the imaging device and the subject is calculated from electric charge acquired from the light receiving circuits, an amount of electric charge read due to reflected light differs depending on the light receiving circuits, for example, even if the distance between the measuring instrument and the subject is the same. Accordingly, a result of measurement of a distance based on the time of flight of light between the imaging device and the subject has different offsets depending on the light receiving circuits and it is not possible to measure a distance between the measuring instrument and the subject with high accuracy.

For the purpose of solving this problem, in Patent Literature 1, a skew adjusting circuit is provided and a drive signal for reading electric charge from a light receiving circuit is supplied to each light receiving circuit. That is, driver circuits are formed in a clock tree structure and drive signals are supplied to all the light receiving circuits arranged in a grid shape at the same timing without a delay.

CITATION LIST

Patent Literature

[Patent Literature 1]
WO2016/170833

SUMMARY OF INVENTION

Technical Problem

As described above, in Patent Literature 1, since the skew adjusting circuit is provided, a drive signal can be supplied to all the light receiving circuits at the same timing.

However, since the drive signal is simultaneously supplied to the light receiving circuits of all the pixels, the light receiving circuits are simultaneously driven at a rising timing of the drive signal and thus a large peak current flows when a drive circuit starts its driving.

For example, when reading from a light receiving circuit is performed by driving a metal oxide semiconductor (MOS) transistor, gate voltages of the MOS transistors of all the light receiving circuits are increased to a voltage at which the MOS transistors are turned on, and thus a peak current flows transiently at the rising of the drive signal.

When the number of pixels is small, the quantity of the peak current does not cause any problem, but with an increase of the number of pixels to enhance a resolution of an image with which a distance is measured, the number of light receiving circuits also increases and the quantity of the peak current flowing at the time of driving start also increases.

Accordingly, since the peak current increases suddenly when the drive signal is supplied to the light receiving circuits, ringing occurs in a source voltage due to an inductance of a bonding wire for supplying the source voltage to a chip of the range image sensor.

Due to fluctuation of the source voltage based on the ringing, the drive signal may not rise sufficiently or a pulse shape of the drive signal may change depending on a pulse width of the drive signal, and thus electric charge cannot be accurately read from the light receiving circuits.

In consideration of the aforementioned problems, an objective of one aspect of the invention is to provide a range image sensor and a range image pickup device that can curb a peak current which is generated at the time of reading electric charge by driving light receiving circuits even when the number of pixels in the range image sensor increases, read electric charge from the light receiving circuits, and accurately measure a distance between a measuring instrument and a subject.

Solution to Problem

A range image sensor according to one aspect of the present invention includes: a light receiving pixel in which pixel circuits are arranged in a two-dimensional grid shape, each pixel circuit including a photoelectric conversion element that receives reflected light which is emitted by a subject in a measuring space which is a space to be measured reflecting optical pulses with the same pulse width which are applied to the measuring space from a predetermined light source at intervals of a predetermined cycle and generates electric charge corresponding to the received reflected light and a charge storage portion that stores the electric charge, each pixel circuit storing the electric charge in the charge storage portion in synchronization with application of the optical pulses; and a pixel drive circuit that supplies a storage drive signal for storing the electric charge in the charge storage portion from the photoelectric conversion element to the pixel circuits, wherein the pixel drive circuit supplies the storage drive signal which is shifted by a predetermined adjustment time between the pixel circuits and stores the electric charge from the photoelectric conversion element in the charge storage portion in each pixel circuit.

In the range image sensor according to one aspect of the present invention, the adjustment time is set to correspond to a lower limit of a measuring range of the subject in the measuring space and the number of pixel circuits between which the storage drive signal is shifted.

In the range image sensor according to one aspect of the present invention, the charge storage portion includes a first charge storage portion and a second storage portion, and the pixel drive circuit sequentially outputs a first storage drive signal and a second storage drive signal with the same pulse width in the cycle as the storage drive signal in synchronization with the application of the optical pulses and distributes and stores electric charge which is generated by the photoelectric conversion element on the basis of a first received light quantity in a period of the first storage drive signal of the reflected light and electric charge which is generated by the photoelectric conversion element on the basis of a second received light quantity in a period of the second storage drive signal of the reflected light to the first charge storage portion and the second charge storage portion to calculate a distance between the range image sensor and the subject.

In the range image sensor according to one aspect of the present invention, the pixel drive circuit includes a timing adjustment circuit that performs timing adjustment for shifting a clock signal which is used to generate the storage drive signals by the adjustment time and a driver circuit that receives the clock signal supplied from the timing adjustment circuit and supplies the storage drive signals in correspondence with each column of the pixel circuits in the light receiving pixel, the timing adjustment circuits being connected in series by wire, the timing adjustment circuit at a position corresponding to an input terminal of each driver circuit being supplied with the clock signal for generating the storage drive signal.

In the range image sensor according to one aspect of the present invention, an inter-terminal wiring portion between input terminals of the driver circuit is formed in the timing adjustment circuit such that a time constant based on a wiring capacitance and a wiring resistance of the inter-terminal wiring portion and an input capacitance of the drive circuit becomes the adjustment time.

In the range image sensor according to one aspect of the present invention, the clock signal is supplied to the timing adjustment circuit located at the center of an array of the timing adjustment circuits connected in series.

In the range image sensor according to one aspect of the present invention, columns of the pixel circuits arranged in a grid shape in the light receiving pixel are divided into a predetermined number of blocks, the timing adjustment circuits that supply the clock signal to the drive circuits corresponding to the pixel circuits in each block are connected in series, and the clock signal is supplied to one of the timing adjustment circuits connected in series in the block.

In the range image sensor according to one aspect of the present invention, columns of the pixel circuits arranged in a grid shape in the light receiving pixel are divided into a predetermined number of blocks, input terminals of the drive circuits in each block are connected by a block wire, the timing adjustment circuit is provided for each block wire, the timing adjustment circuits are connected in series, and the clock signal is supplied to one of the timing adjustment circuits connected in series.

In the range image sensor according to one aspect of the present invention, the light receiving pixel is formed in a first layer, the pixel drive circuit is formed in a second layer, and the storage drive signal is supplied to the pixel circuits in the light receiving pixel from the pixel drive circuit via inter-layer wires.

In the range image sensor according to one aspect of the present invention, the pixel drive circuit is formed in the second layer in parallel to a central row of an array of rows of the pixel circuits in the light receiving pixel and the storage drive signal is supplied to the pixel circuits from the pixel drive circuit via the inter-layer wires.

In the range image sensor according to one aspect of the present invention, the light receiving pixel is formed in a first layer and the pixel drive circuit is formed in a second layer, all input terminals of the pixel circuits arranged in a grid shape in the light receiving pixel are connected via a common signal line and the clock signal for generating the storage drive signal is supplied to the signal line at a position of the pixel circuit located at the center of the grid shape, and wires between the pixel circuits are formed such that a time constant based on a wiring resistance, a wiring capacitance, and a capacitance of an input terminal of each pixel circuit between all the pixel circuits adjacent to each other becomes the adjustment time.

A range image pickup device according to one aspect of the present invention includes: any one of the above-described range image sensor; a light source that applies optical pulses with the same pulse width to a measuring space which is a space to be measured at intervals of a predetermined cycle; and a range image processor that calculates a distance between the range image sensor and the subject which is located in the measuring space on the basis of a charge quantity which is a quantity of the electric charge distributed a predetermined fixed number of times of charge distribution and stored in a first charge storage portion and a second charge storage portion in the charge storage portion, wherein the range image processor corrects a distance calculated for each pixel circuit on the basis of the charge quantities of the first charge storage portion and the second charge storage portion using the position of the corresponding pixel circuit and the adjustment time and outputs the corrected distance as the distance.

Advantageous Effects of Invention

According to one aspect of the invention, it is possible to provide a range image sensor and a range image pickup device that can curb a peak current which is generated at the time of reading electric charge by driving light receiving circuits even when the number of pixels in the range image sensor increases, read electric charge from the light receiving circuits, and accurately measure a distance between a measuring instrument and a subject.

DESCRIPTION OF EMBODIMENTS

Hereinafter, embodiments of the invention will be described with reference to the accompanying drawings.

Figure 1:
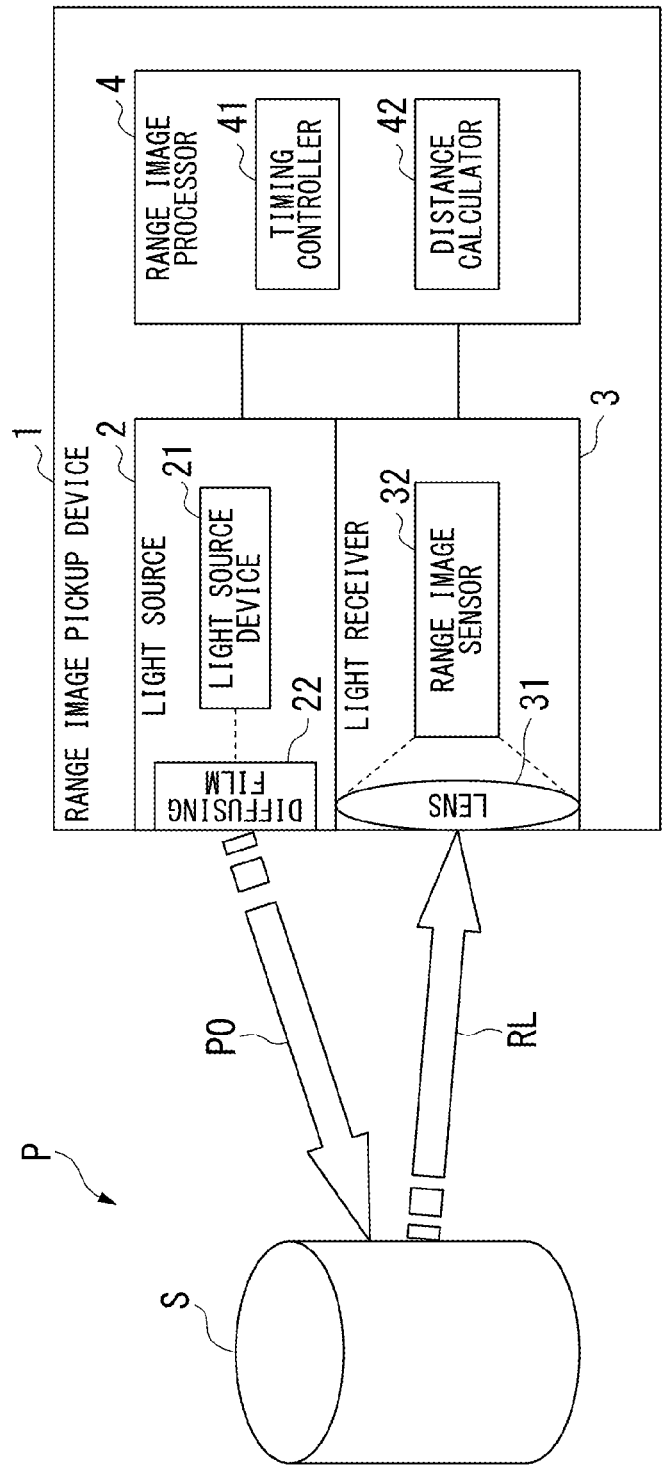
FIG. 1 is a block diagram schematically illustrating a configuration of a range image pickup device according to an embodiment of the invention.

FIG. 1 is a block diagram schematically illustrating a range image pickup device according to an embodiment. A subject S which is a subject from which a distance is measured by the range image pickup device 1 is also illustrated in FIG. 1.

The range image pickup device 1 with the configuration illustrated in FIG. 1 includes a light source 2, a light receiver 3, and a range image processor 4.

The light source 2 applies an intermittent optical pulse PO to a space in which a subject S to which a distance is to be measured by the range image pickup device 1 is present at predetermined intervals under the control of the range image processor 4. The light source 2 is, for example, a surface emission type semiconductor laser module such as a vertical cavity surface emitting laser (VCSEL).

A light source device 21 is, for example, a light source that emits laser light in an infrared wavelength band (for example, a wavelength band of 850 nm to 940 nm) which is an optical pulse PO applied to a subject S. The light source device 21 is, for example, a semiconductor laser emitting device. The light source device 21 emits pulse-like laser light (an optical pulse PO) under the control of a timing controller 41.

A diffusing film 22 is an optical component that diffuses laser light in an infrared wavelength band emitted from the light source device 21 to a size with a predetermined sectional area which is applied to a measuring space P in which a subject S is present. The pulse-like laser light diffused by the diffusing film 22 is emitted as an optical pulse PO from the light source 2 and is applied to the subject S in the measuring space P.

The light receiver 3 receives reflected light RL of the optical pulse PO reflected by the subject S to which a distance is to be measured by the range image pickup device 1 and outputs a pixel signal based on the received reflected light RL.

A lens 31 is an optical lens that guides incident reflected light RL to a range image sensor 32. The lens 31 emits the incident reflected light RL to the range image sensor 32 such that the reflected light is received by (incident on) pixels provided in a light receiving area of the range image sensor 32.

The range image sensor 32 is an imaging device that is used for the range image pickup device 1. The range image sensor 32 is an imaging device that includes a plurality of pixels in a two-dimensional light receiving area and in which each pixel has a distribution configuration with one photoelectric conversion element, a plurality of charge storage portions corresponding to the one photoelectric conversion element, and an element distributing electric charge to the charge storage portions which are provided therein. Under the control of the timing controller 41, the range image sensor 32 distributes electric charge generated from the photoelectric conversion element of each pixel to the charge storage portions and outputs a pixel signal corresponding to a quantity of electric charge distributed to each charge storage portion.

In the range image sensor 32, a plurality of pixels are arranged in a two-dimensional grid shape (a matrix shape) and a pixel signal of one frame corresponding to each pixel is output.

The range image processor 4 is a controller that controls the range image pickup device 1 as a whole and is also a calculator that calculates a distance to a subject S which is measured by the range image pickup device 1. The range image processor 4 includes a timing controller 41 and a distance calculator 42.

The timing controller 41 controls a timing at which the light source 2 applies an optical pulse PO to a subject S, a timing at which the range image sensor 32 provided in the light receiver 3 receives reflected light RL, and the like.

The distance calculator 42 outputs distance information which is obtained by calculating a distance between the range image pickup device 1 and the subject S on the basis of a pixel signal output from the range image sensor 32.

With this configuration, in the range image pickup device 1, the light receiver 3 receives reflected light RL which is acquired because the optical pulse PO in an infrared wavelength band applied to a subject S from the light source 2 is reflected by the subject S and the range image processor 4 outputs distance information indicating the measured distance to the subject S.

In FIG. 1, a configuration in which the range image processor 4 is provided inside the range image pickup device 1 is illustrated, but the range image processor 4 may be an element that is provided outside the range image pickup device 1.

Figure 2:
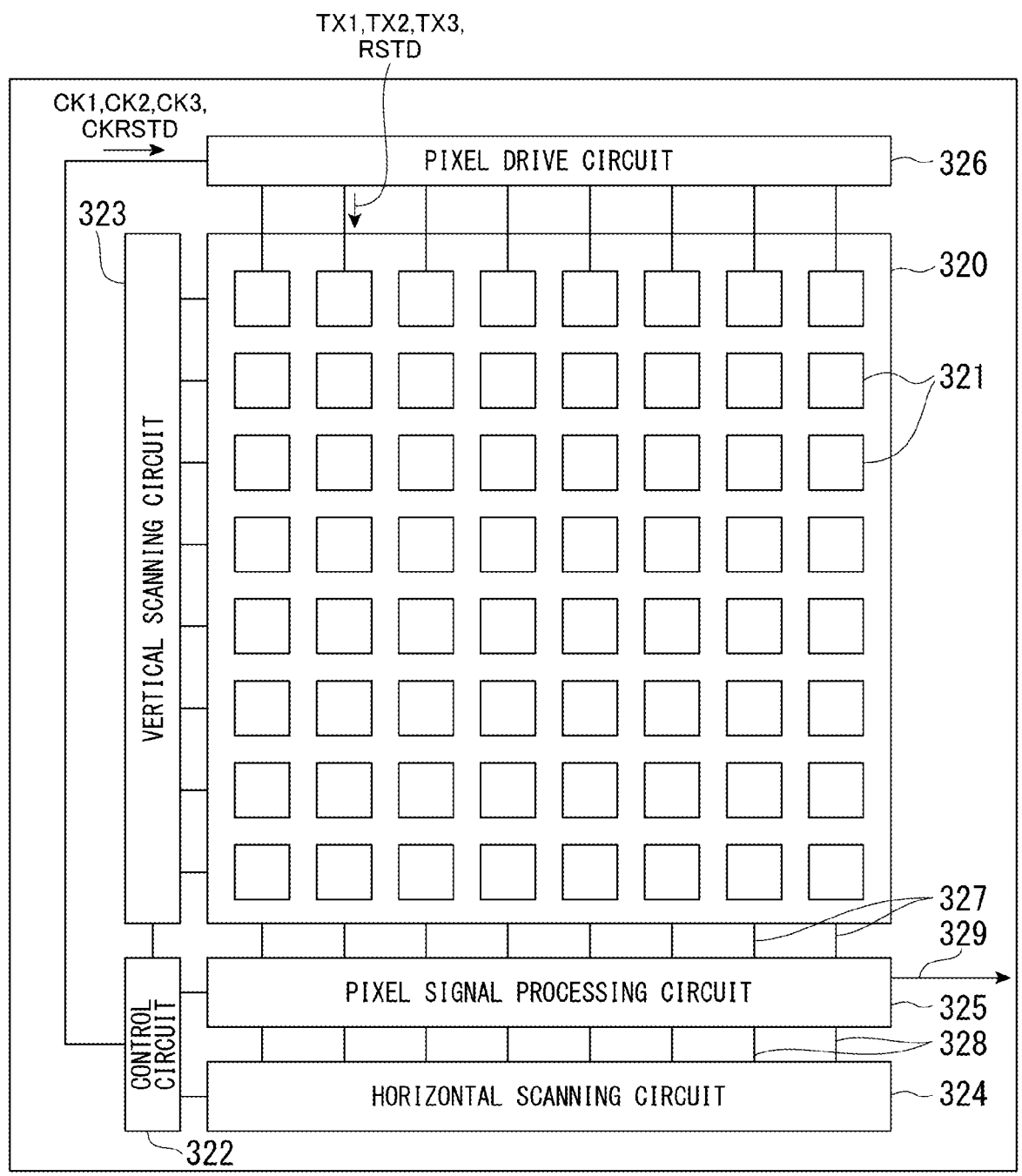
FIG. 2 is a block diagram schematically illustrating a configuration of an imaging device (a range image sensor 32) that is used for the range image pickup device 1 according to the embodiment of the invention.

The configuration of the range image sensor 32 that is used as an imaging device in the range image pickup device 1 will be described below. FIG. 2 is a block diagram schematically illustrating a configuration of an imaging device (the range image sensor 32) that is used for the range image pickup device 1 according to the embodiment of the invention. In FIG. 2, the range image sensor 32 includes a light receiving area 320 in which a plurality of pixel circuits 321 are arranged, a control circuit 322, a vertical scanning circuit 323, a horizontal scanning circuit 324, a pixel signal processing circuit 325, and a pixel drive circuit 326. In the example of the range image sensor 32 illustrated in FIG. 2, a plurality of pixel circuits 321 are arranged in a two-dimensional grid shape of eight rows and eight columns in the light receiving area 320.

The control circuit 322 controls elements of the range image sensor 32 such as the vertical scanning circuit 323, the horizontal scanning circuit 324, the pixel signal processing circuit 325, and the pixel drive circuit 326. For example, the control circuit 322 controls operations of the elements of the range image sensor 32 under the control of the range image processor 4 (more specifically the timing controller 41) of the range image pickup device 1. For example, the control of the elements of the range image sensor 32 by the control circuit 322 may be directly performed by the range image processor 4 (more specifically the timing controller 41). In this case, the range image sensor 32 may not include the control circuit 322.

The pixel drive circuit 326 outputs storage drive signals (storage drive signals TX1, TX2, and TX3 and a reset drive signal RSTD which will be described later) for distributing and storing electric charge generated from photoelectric conversion elements (photoelectric conversion elements PD which will be described later) of the pixel circuits 321 arranged in a grid shape in a plurality of charge storage portions (charge storage portions CS1, CS2, and CS3 which will be described later) in the pixel circuits 321 to the pixel circuits 321 which are arranged in a grid shape in the light receiving pixel 320 in units of columns.

The vertical scanning circuit 323 is a drive circuit that controls the pixel circuits 321 arranged in the light receiving pixel 320 under the control of the control circuit 322 and outputs (reads) a signal of a voltage (hereinafter referred to as a "voltage signal") corresponding to a quantity of electric charge obtained by photoelectrically converting incident light from the pixel circuits 321 to a corresponding vertical signal line 327. The vertical scanning circuit 323 outputs control signals (selection drive signals SEL1, SEL2, and SEL3 which will be described later) for driving (controlling) a pixel circuit 321 to read electric charge to the pixel circuits 321 arranged in a grid shape in the light receiving pixel 320 in units of rows.

Accordingly, a voltage signal corresponding to a quantity of electric charge distributed to the charge storage portions in the pixel circuit 321 is read to the corresponding vertical signal line 327 for each row of the light receiving pixel 320 and is output to the pixel signal processing circuit 325.

In the light receiving pixel 320, each pixel circuit 321 receives reflected light RL which is obtained because an optical pulse PO applied to a subject S from the light source 2 is reflected by the subject S and generates electric charge corresponding to a quantity of light of the received reflected light RL (a received light quantity). In each pixel circuit 321, the pixel drive circuit 326 distributes and stores electric charge corresponding to a quantity of the received reflected light RL (a received light quantity) to one of a plurality of charge storage portions by outputting the storage drive signals to the pixel circuit. In each pixel circuit 321, the vertical scanning circuit 323 outputs a voltage signal with a magnitude corresponding to the quantity of electric charge distributed and stored in the charge storage portions to the corresponding vertical signal line 327 by outputting a reading drive signal to the pixel circuit. Details of the configuration and the drive (control) method of each pixel circuit 321 will be described later.

The pixel signal processing circuit 325 is a signal processing circuit that performs predetermined signal processing on voltage signals which are output from the pixel circuits of each column to the corresponding vertical signal line under the control of the control circuit 322. An example of the predetermined signal processing is a noise reducing process of reducing noise included in the voltage signals by correlated double sampling (CDS). An example of the predetermined signal processing is an analog/digital conversion (A/D conversion) process of converting an analog voltage signal to a digital value indicating its magnitude.

The pixel signal processing circuit 325 may be a pixel signal processing circuit group including a plurality of pixel signal processing circuits corresponding to the columns of the light receiving pixel 320. In this case, the pixel signal processing circuit 325 outputs the voltage signal subjected to the predetermined signal processing to a horizontal signal line 329 for each row of the light receiving pixel 320 under the control of the horizontal scanning circuit 324.

The horizontal scanning circuit 324 is a drive circuit that sequentially outputs (reads) the voltage signal subjected to the signal processing and output from the pixel signal processing circuit 325 via a signal line 328 to the horizontal signal line 329 under the control of the control circuit 322. The horizontal scanning circuit 324 sequentially outputs a reading drive signal for outputting a voltage signal corresponding to the pixel circuits 321 of each column to the pixel signal processing circuit 325. Accordingly, the voltage signal of one frame subjected to the signal processing and output from the pixel signal processing circuit 325 is sequentially output as a pixel signal of one frame to the outside of the range image sensor 32 via the horizontal signal line 329. At this time, the range image sensor 32 outputs the voltage signal subjected to the signal processing as a pixel signal to the outside of the range image sensor 32 from an output circuit which is not illustrated such as an output amplifier.

In the following description, the pixel signal processing circuit 325 provided in the range image sensor 32 performs the noise reducing process on a voltage signal output from the pixel circuits 321, then performs the A/D conversion process thereon, and outputs the resultant signal, that is, outputs a voltage signal converted to a digital value from the horizontal signal line 329.

Figure 3:
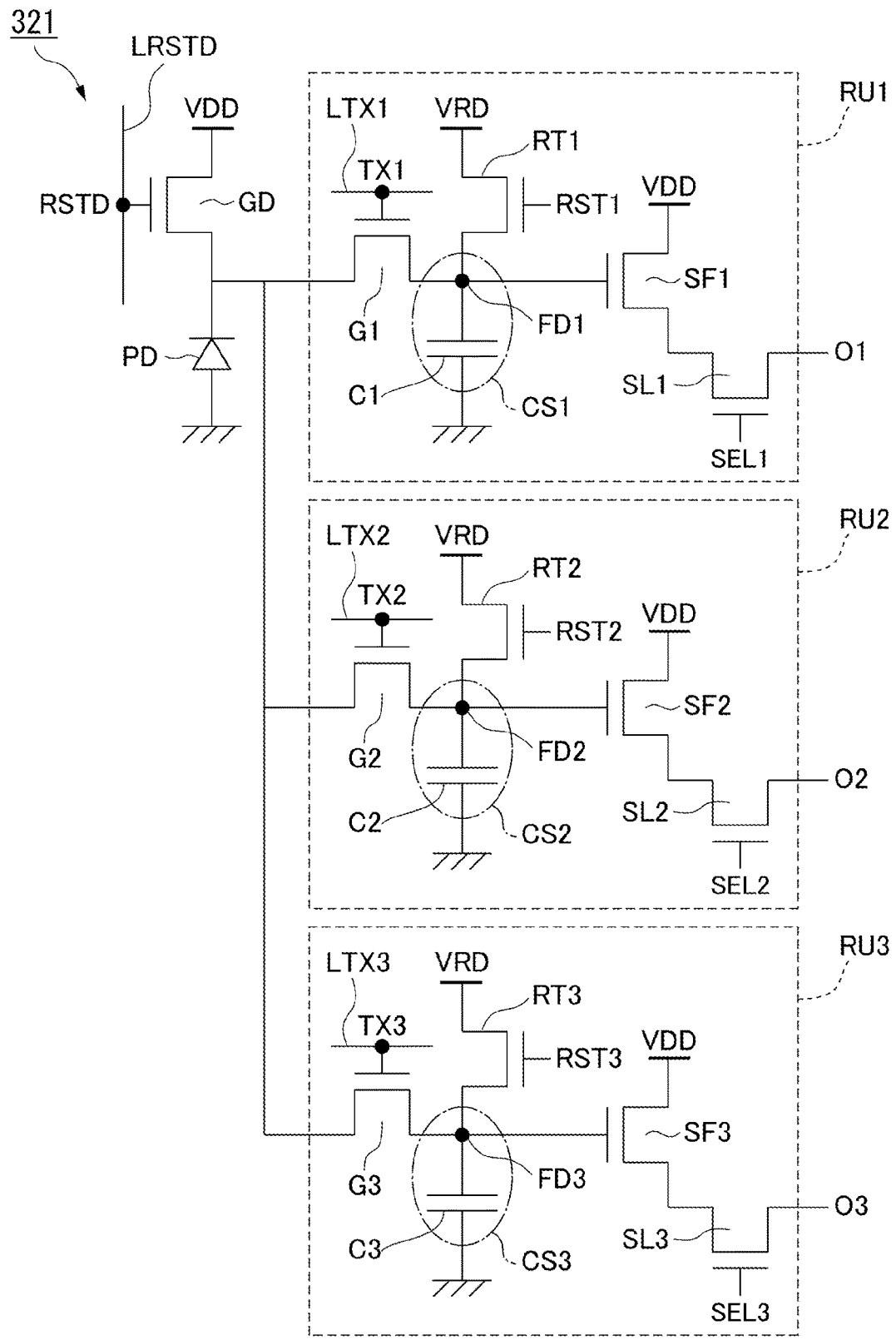
FIG. 3 is a circuit diagram illustrating an example of a configuration of a pixel circuit 321 which is disposed in a light receiving pixel 320 of the imaging device (the range image sensor 32) that is used for the range image pickup device 1 according to the embodiment of the invention.

The configuration of a pixel circuit 321 disposed in the light receiving area 320 of the range image sensor 32 will be described below. FIG. 3 is a circuit diagram illustrating an example of a configuration of a pixel circuit 321 disposed in the light receiving area 320 of the imaging device (the range image sensor 32) that is used for the range image pickup device 1 according to the embodiment of the invention. FIG. 3 illustrates an example of the configuration of one pixel circuit 321 out of a plurality of pixel circuits 321 which are arranged in the light receiving area 320. In this example, each pixel circuit 321 includes three pixel signal reading portions.

The pixel circuit 321 includes one photoelectric conversion element PD, a drain gate transistor GD, and three pixel signal reading portions RU that output a voltage signal from a corresponding output terminal O. Each pixel signal reading portion RU includes a reading gate transistor G, a floating diffusion FD, a charge storage capacitor C, a reset gate transistor RT, a source follower gate transistor SF, and a selection gate transistor SL. In each pixel signal reading portion RU, a charge storage portion CS is constituted by the floating diffusion FD and the charge storage capacitor C. The drain gate transistor GD, the reading gate transistor G, the reset gate transistor RT, the source follower gate transistor SF, and the selection gate transistor SL are enhancement type N-channel MOS transistors.

In FIG. 3, the pixel signal reading portions RU are distinguished by adding the numerals "1," "2," or "3" as suffixes to the reference sign "RU" of the three pixel signal reading portions RU. Similarly, the pixel signal reading portions RU corresponding to the elements are distinguished by adding the numerals indicating the pixel signal reading portions RU to the signs of elements of the three pixel signal reading portions RU. In the pixel circuit 321 illustrated in FIG. 3, the pixel signal reading portion RU1 that outputs a voltage signal from an output terminal O1 includes a gate transistor G1, a floating diffusion FD1, a charge storage capacitor C1, a reset gate transistor RT1, a source follower gate transistor SF1, and a selection gate transistor SL1. In the pixel signal reading portion RU1, a charge storage portion CS1 is constituted by the floating diffusion FD1 and the charge storage capacitor C1. The pixel signal reading portion RU2 and the pixel signal reading portion RU3 have the same configuration.

The photoelectric conversion element PD is an embedded photodiode that photoelectrically converts incident light to generate electric charge and stores the generated electric charge. In one aspect of the invention, the structure of the photoelectric conversion element PD provided in the pixel circuit 321 is not particularly limited. Accordingly, the photoelectric conversion element PD may be, for example, a PN photodiode with a structure in which a P type semiconductor and an N type semiconductor are bonded or a PIN photodiode with a structure in which an I type semiconductor is interposed between a P type semiconductor and an N type semiconductor. The photoelectric conversion element provided in the pixel circuit 321 is not limited to a photodiode and may be, for example, a photo-gate type photoelectric conversion element.

The drain gate transistor GD is a transistor that discards electric charge which has been generated and stored by the photoelectric conversion element PD and which has not been transmitted to the pixel signal reading portions RU in accordance with a drive signal input from the vertical scanning circuit 323. That is, the drain gate transistor GD is a transistor that resets electric charge which has been generated by the photoelectric conversion element PD and has not been used to measure a distance to a subject S.

The reading gate transistor G is a transistor that transmits electric charge generated and stored by the photoelectric conversion element PD to the corresponding charge storage portion CS in accordance with a drive signal input from the vertical scanning circuit 323. Electric charge transmitted by the reading gate transistor G is held (stored) in the corresponding charge storage portion CS.

Here, in the pixel signal reading portion RU1 the drain of the reading gate transistor G1 is connected to a second terminal of the photoelectric conversion element PD, the gate thereof is connected to a signal line LTX1 in which a storage drive signal TX1 propagates, and the source thereof is connected to the floating diffusion FD1 and a first terminal of the charge storage capacitor C1.

Similarly, in the pixel signal reading portion RU2, the drain of the reading gate transistor G2 is connected to a second terminal of the photoelectric conversion element PD, the gate thereof is connected to a signal line LTX2 in which a storage drive signal TX2 propagates, and the source thereof is connected to the floating diffusion FD2 and a first terminal of the charge storage capacitor C2.

Similarly, in the pixel signal reading portion RU3, the drain of the reading gate transistor G3 is connected to a third terminal of the photoelectric conversion element PD, the gate thereof is connected to a signal line LTX3 in which a storage drive signal TX3 propagates, and the source thereof is connected to the floating diffusion FD3 and a first terminal of the charge storage capacitor C3.

The storage drive signal TX1, the storage drive signal TX2, and the storage drive signal TX3 are supplied from the pixel drive circuit 326 via the signal line LTX1, the signal line LTX2, and the signal line LTX3.

The charge storage capacitor C is a capacitor that holds (stores) electric charge transmitted by the corresponding reading gate transistor G.

The reset gate transistor RT is a transistor that discards electric charge held in the corresponding charge storage portion CS in accordance with a drive signal input from the vertical scanning circuit 323. That is, the reset gate transistor RT is a transistor that resets electric charge held in the corresponding charge storage portion CS.

The source follower gate transistor SF is a transistor that amplifies a voltage signal corresponding to a quantity of electric charge stored in the charge storage portion CS connected to the gate terminal thereof and outputs the amplified voltage signal to the corresponding selection gate transistor SL.

The selection gate transistor SL is a transistor that outputs a voltage signal amplified by the corresponding source follower gate transistor SF from the corresponding output terminal O in accordance with a drive signal input from the vertical scanning circuit 323.

With this configuration, in the pixel circuit 321, electric charge which is generated by the photoelectric conversion element PD photoelectrically converting incident light is distributed to three charge storage portions CS and voltage signals corresponding to quantities of the distributed electric charge are output to the pixel signal processing circuit 325.

The configuration of a pixel which is disposed in the range image sensor 32 is not limited to the configuration including three pixel signal reading portions RU as illustrated in FIG.

3, and may be a pixel having any configuration as long as it is a pixel having a configuration including one photoelectric conversion element PD and a plurality of pixel signal reading portions RU that distribute electric charge generated and stored by the photoelectric conversion element PD. That is, the number of pixel signal reading portions RU (charge storage portions CS) provided in each pixel of the range image sensor 32 may be two or four or more.

In the example of the pixel circuit 321 with the configuration illustrated in FIG. 3, a charge storage portion CS is constituted by a floating diffusion FD and a charge storage capacitor C. However, the charge storage portion CS has only to be constituted by at least the floating diffusion FD. That is, the pixel circuit 321 may have a configuration not including the charge storage capacitors C. With this configuration, it is possible to enhance charge detection sensitivity. However, in view of an increase in dynamic range in measuring a distance in the range image pickup device 1, a configuration for holding (storing) more electric charge is superior. Accordingly, in the pixel circuit 321, by providing a charge storage capacitor C in the pixel signal reading portion RU and forming the charge storage portion CS using the floating diffusion FD and the charge storage capacitor C, a configuration for holding (storing) more electric charge can be realized in comparison with a configuration in which the charge storage portion CS includes only the floating diffusion FD.

In the example of the configuration illustrated in FIG. 3, the pixel circuit 321 includes the drain gate transistor GD, but when it is not necessary to discard electric charge stored (left) in the photoelectric conversion element PD, each pixel disposed in the range image sensor 32 may not include the drain gate transistor GD.

Figure 4:
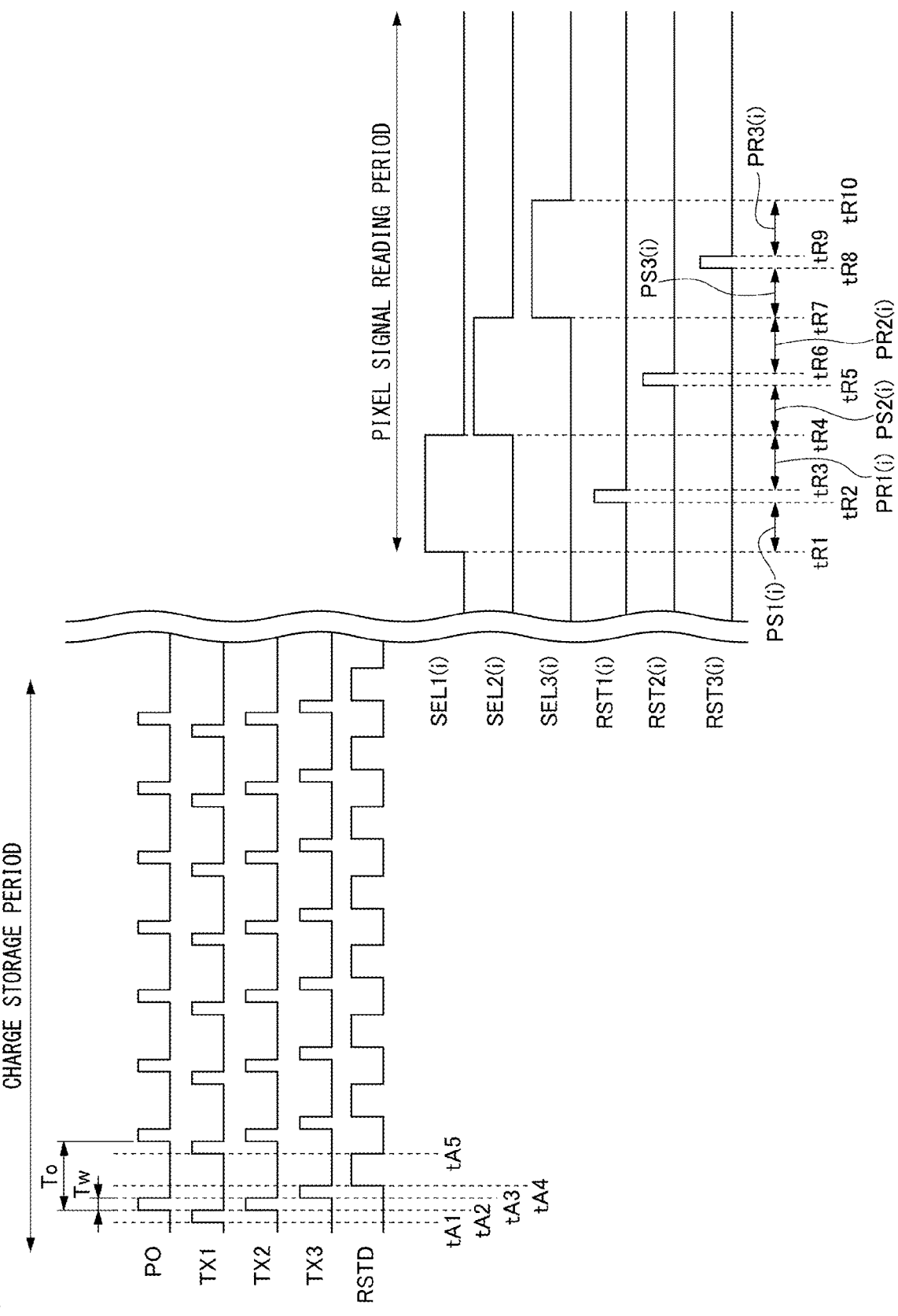
FIG. 4 is a timing chart illustrating timings for driving a pixel circuit 321 which is disposed in the light receiving pixel 320 of the imaging device (the range image sensor 32) that is used for the range image pickup device 1 according to the embodiment of the invention.

A method (timing) of driving (controlling) of the pixel circuits 321 in the range image pickup device 1 will be described below. FIG. 4 is a timing chart illustrating timings at which the pixel circuits 321 arranged in the light receiving area 320 of the imaging device (the range image sensor 32) which is used for the range image pickup device 1 according to the embodiment of the invention are driven. FIG. 4 illustrates timings of drive signals for the pixel circuits 321 when a pixel signal corresponding to one frame is output from the range image sensor 32 and timings of optical pulses PO which are applied to a subject S from the light source 2.

First, driving (control) of a pixel circuit 321 in a charge storage period in which electric charge which is generated and stored by the photoelectric conversion element PD according to a quantity of received light (a received light quantity) is distributed to the corresponding pixel signal reading portions RU will be described. In a charge storage period, optical pulses PO are applied to a subject S by the light source 2. Electric charge based on received background light and reflected light RL is distributed to the charge storage portions CS by driving the pixel circuit 321 in synchronization with the timing at which optical pulses PO are applied. The pixel drive circuit 326 distributes and stores electric charge in the charge storage portions CS of all the pixel circuits 321 by so-called global shutter driving of simultaneously driving all the pixel circuits 321 arranged in the light receiving area 320. A period of time in which the light source device 21 emits pulse-like laser light, that is, a pulse width Tw of an optical pulse PO, is a predetermined very short time such as 10 nS. This is because a maximum distance which is measurable (hereinafter referred to as "maximum measurable distance") is determined by the pulse width Tw of an optical pulse PO in measuring a distance using a pulse modulation system. When the pulse width Tw of an optical pulse PO is 10 nS, the maximum measurable distance is 1.5 m. When the pulse width Tw of an optical pulse is simply made to be increased, that is, an emission time of laser light in the light source device 21 is made to be increased, the photoelectric conversion element PD can receive more reflected light RL but a resolution in distance to a subject S which is measured is decreased. On the other hand, when the pulse width Tw of an optical pulse PO is decreased, a quantity of electric charge which is generated through photoelectric conversion by the photoelectric conversion element PD is also decreased. Accordingly, in the range image pickup device 1, application of an optical pulse PO and distribution of electric charge are performed a plurality of times such that a sufficient quantity of electric charge is stored in each charge storage portion CS in the charge storage period.

Now, a configuration of causing the vertical scanning circuit 323 and the pixel drive circuit 326 to drive (control) the pixel circuits 321 will be described. In the following description, the control circuit 322 outputs clock signals CK1, CK2, CK3, and CKRSTD for generating storage drive signals TX1, TX2, and TX3 and a reset drive signal RSTD to the pixel drive circuit 326. The control circuit 322 outputs clock signals for generating selection drive signals SEL1, SEL2, and SEL3 and reset signals RST1, RST2, and RST3 to the vertical scanning circuit 323.

In the charge storage period in the timing chart illustrated in FIG. 4, driving timings of a pixel circuit 321 when application of an optical pulse PO and distribution of electric charge to all the pixel circuits 321 are performed a plurality of times are illustrated. In the charge storage period in the timing chart illustrated in FIG. 4, it is assumed that an optical pulse PO is applied (the light source device 21 emits laser light) when the optical pulse PO is at a "H (High)" level and application of the optical pulse PO is stopped (the light source device 21 is turned off) when the optical pulse is at a "L (Low)" level. In the timing chart illustrated in FIG. 4, it is assumed that the charge storage period starts in a state in which all the pixel circuits 321 are reset, that is, no electric charge is stored in the photoelectric conversion element PD and the charge storage portions CS.

In the charge storage period in the timing chart illustrated in FIG. 4, driving timings of a pixel circuit 321 when application of an optical pulse PO and distribution of electric charge to all the pixel circuits 321 are performed a plurality of times are illustrated. Out of signal levels illustrated in FIG. 4, the "H" level is a voltage value of a source voltage VDD and the "L" level is a voltage value of a source voltage VSS. In the charge storage period in the timing chart illustrated in FIG. 4, an optical pulse PO is applied (the light source device 21 emits laser light) when the optical pulse PO is at the "H" level and application of the optical pulse PO is stopped (the light source device 21 is turned off) when the optical pulse is at the "L" level. In the timing chart illustrated in FIG. 4, the charge storage period starts in a state in which all the pixel circuits 321 are reset, that is, no electric charge is stored in the photoelectric conversion element PD and the charge storage portions CS. In the following description, a period of time from time tA1 to tA5 is a storage cycle in which electric charge is distributed and a plurality of storage cycles are repeated in the charge storage period. For example, a time width between times tA1, tA2, tA3, and tA4, that is, the pulse width of an optical pulse PO and the storage drive signals TX1, TX2, and TX3 are the same as Tw.

In the charge storage period, first, the pixel drive circuit 326 transmits electric charge corresponding to background light before an optical pulse PO is applied, which is generated through photoelectric conversion by the photoelectric conversion element PD, to the charge storage portion CS1 via the reading gate transistor G1 and stores the electric charge therein at time tA1 before the same time as the pulse width Tw in which the light source 2 applies an optical pulse PO.

Thereafter, the pixel drive circuit 326 transmits electric charge which is currently generated according to photoelectric-converted light by the photoelectric conversion element PD to the charge storage portion CS2 via the reading gate transistor G2 and stores the electric charge therein at time tA2 which is the same time as the timing at which the light source 2 applies an optical pulse PO. Here, electric charge stored in the charge storage portion CS2 is electric charge based on reflected light RL which is reflected by the subject S within the time corresponding to the pulse width Tw in which the optical pulse PO is applied. This electric charge includes electric charge based on reflected light RL which is incident in a short delay time proportional to a distance (an absolute distance) to the subject S in addition to electric charge based on background light. More specifically, for example, when the subject S is located at a close position, the applied optical pulse PO is reflected by the subject S and is returned as reflected light RL in a short period of time and thus much electric charge based on the reflected light RL reflected by the subject S located at a close position is stored in the charge storage portion CS2.

Thereafter, the pixel drive circuit 326 transmits electric charge which is currently generated according to photoelectric-converted light by the photoelectric conversion element PD to the charge storage portion CS3 via the reading gate transistor G3 and stores the electric charge therein at time tA3 which is the same time as the timing at which the light source 2 stops application of the optical pulse PO. Here, electric charge stored in the charge storage portion CS3 is electric charge based on reflected light RL which is reflected by the subject S outside the time corresponding to the pulse width Tw in which the optical pulse PO is applied. This electric charge includes electric charge based on reflected light RL which is incident in a long delay time proportional to a distance (an absolute distance) to the subject S in addition to electric charge based on background light. More specifically, for example, when the subject S is located at a far position, the applied optical pulse PO is reflected by the subject S and is returned as reflected light RL in a long period of time and thus much electric charge based on the reflected light RL reflected by the subject S located at a far position is stored in the charge storage portion CS3.

Thereafter, the pixel drive circuit 326 discards electric charge which is generated according to light which is currently photoelectrically converted by the photoelectric conversion element PD, that is, electric charge which is not used to measure a distance to the subject S, via the drain gate transistor GD at time tA4 after the same period of time as the pulse width Tw in which the light source 2 applies the optical pulse PO. In other words, the photoelectric conversion element PD is reset.

Thereafter, the pixel drive circuit 326 releases the reset of the photoelectric conversion element PD at time tA5 before the same period of time as the pulse width Tw in which the light source 2 applies an optical pulse PO next. Then, the pixel drive circuit 326 transmits electric charge which is next generated through photoelectric conversion by the photoelectric conversion element PD, that is, electric charge corresponding to background light before an optical pulse PO is applied next, to the charge storage portion CS1 via the reading gate transistor G1 and stores the electric charge therein in the same way as at the timing of time tA1.

Thereafter, the pixel drive circuit 326 repeatedly performs the same driving of a pixel circuit 321 as described above from time tA1 to time tA5 (hereinafter referred to as "charge distribution driving"). Accordingly, in the charge storage period, quantities of electric charge corresponding to repetition of the charge distribution driving are stored and held in the charge storage portions CS of all the pixel circuits 321. The maximum number of times of repetition of the charge distribution driving in the charge storage period is determined by a cycle in which the range image sensor 32 outputs (acquires) a pixel signal of one frame. More specifically, the maximum number of times of repetition corresponds to a share obtained by dividing a period of time, which is acquired by subtracting a pixel signal reading period from a period of time in which the range image sensor 32 acquires a pixel signal of one frame, by a period of time in which the light source device 21 emits pulse-like laser light, that is, a pulse period To of an optical pulse PO. In the range image sensor 32, as the number of times of charge distribution driving increases, a quantity of electric charge stored (integrated) in each charge storage portion CS increases and sensitivity thereof becomes higher. Accordingly, with the range image sensor 32, it is possible to enhance a resolution of a distance to a subject S which is measured.

Driving (control) of a pixel circuit 321 in a pixel signal reading period in which a voltage signal corresponding to a quantity of electric charge distributed to the charge storage portion CS provided in each pixel signal reading portion RU is sequentially output by rows of the pixel circuits 321 arranged in the light receiving area 320 after the charge storage period has ended will be described below. In the pixel signal reading period, voltage signals corresponding to quantities of electric charge stored (integrated) and held in the charge storage portions CS of the pixel circuits 321 disposed in the corresponding row are output to the pixel signal processing circuit 325 by rows through so-called rolling driving of driving the pixel circuits 321 arranged in the light receiving area 320 by rows.

As described above, in the range image sensor 32, the pixel signal processing circuit 325 performs predetermined signal processing such as a noise reducing process or an A/D conversion process on the voltage signals output from the pixel circuits 321. Here, the correlated double sampling (CDS) process which is performed as the noise reducing process by the pixel signal processing circuit 325 is a process of calculating a difference between a voltage signal corresponding to a quantity of electric charge stored (integrated) and held in the charge storage portion CS (hereinafter referred to as a "distance pixel voltage signal PS") and a voltage signal corresponding to a quantity of electric charge in a state (a reset state) in which the charge storage portion CS is reset (hereinafter referred to as a "reset voltage signal PR"). Accordingly, in the pixel signal reading period, the voltage signals including the distance pixel voltage signal PS and the reset voltage signal PR which correspond to each charge storage portion CS of the pixel circuits 321 is output to the pixel signal processing circuit 325 by rows.

In the pixel signal reading period in the timing chart illustrated in FIG. 4, driving timings of a pixel circuit 321 when voltage signals including a distance pixel voltage signal PS(i) and a reset voltage signal PR(i) are output from each pixel circuit 321(i) disposed in the i-th row (1y) of the light receiving area 320 in a case in which a plurality of pixel circuits 321 of y rows (where y is an integer equal to or greater than 1) in the horizontal direction (a row direction)

and x columns (where x is an integer equal to or greater than 1) in the vertical direction (a column direction) are arranged in the light receiving area 320 are illustrated. In the timing chart illustrated in FIG. 4, the voltage signals are output in the order of the charge storage portion CS1(*i*), the charge storage portion CS2(*i*), and the charge storage portion CS3(*i*) in each pixel circuit 321(*i*).

In the pixel signal reading period, first, the vertical scanning circuit 323 outputs a distance pixel voltage signal PS1(*i*) from the output terminal O1(*i*) to the pixel signal processing circuit 325 via the vertical signal line in a period of time from time tR1 to time tR2. Accordingly, the pixel signal processing circuit 325 temporarily holds the distance pixel voltage signal PS(i) output from the pixel signal reading portion RU(i) via the vertical signal line.

Thereafter, in a period of time of time tR3 to time tR4, the vertical scanning circuit 323 outputs a reset voltage signal PR1(*i*) from the output terminal O1(*i*) to the pixel signal processing circuit 325 via the vertical signal line. Accordingly, the pixel signal processing circuit 325 calculates a difference between the temporarily held distance pixel voltage signal PS1(*i*) and the reset voltage signal PR1(*i*) output from the pixel signal reading portion RU1(*i*) via the vertical signal line, that is, reduces noise included in the voltage signal corresponding to the quantity of electric charge stored (integrated) and held in the charge storage portion CS1(*i*).

Thereafter, in a period of time of time tR4 to time tR7, similarly to the period of time of time tR1 to time tR4, the vertical scanning circuit 323 outputs a distance pixel voltage signal PS2(*i*) and a reset voltage signal PR2(*i*) from an output terminal O2(*i*) to the pixel signal processing circuit 325 via the vertical signal line. In a period of time of time tR7 to time tR10, similarly to the period of time of time tR1 to time tR4, the vertical scanning circuit 323 outputs a distance pixel voltage signal PS3(*i*) and a reset voltage signal PR3(*i*) from the output terminal O3(*i*) to the pixel signal processing circuit 325 via the vertical signal line.

Thereafter, the vertical scanning circuit 323 sequentially performs the same driving of a pixel circuit 321 as in the period of time of time tR1 to time tR10 (hereinafter referred to as "pixel signal reading driving") on the pixel circuits 321 disposed in another row (for example, the pixel circuits 321 disposed in the (i+1)-th row) of the light receiving area 320, and sequentially outputs a voltage signal from all the pixel circuits 321 arranged in the light receiving area 320.

With this driving (control) method (timing), the pixel drive circuit 326 performs distribution of electric charge generated and stored in the photoelectric conversion element PD to the pixel signal reading portions RU in the pixel circuits 321 arranged in the light receiving area 320 a plurality of times.

The vertical scanning circuit 323 sequentially outputs the voltages signals corresponding to the quantities of electric charge stored (integrated) in the charge storage portions CS of the pixel signal reading portions RU to the pixel signal processing circuit 325 via the vertical signal lines.

The pixel signal processing circuit 325 performs the A/D conversion process on the voltage signals of which noise has been reduced for each row. When the horizontal scanning circuit 324 sequentially outputs the voltage signals in the rows on which the A/D conversion process has been performed by the pixel signal processing circuit 325 via the horizontal signal line in the order of columns in the light receiving area 320, the range image sensor 32 outputs the pixel signals of all the pixel circuits 321 corresponding to one frame to the outside. Accordingly, in the range image pickup device 1, the pixel signals of one frame are output to the distance calculator 42 in the so-called raster order.

As can be seen from the driving (control) timings of a pixel circuit 321 illustrated in FIG. 4, each pixel signal of one frame includes three voltage signals corresponding to the three pixel signal reading portions RU (charge storage portions CS) provided in the corresponding pixel circuit 321. The distance calculator 42 calculates a distance to the subject S on the basis of the pixel signals of one frame output from the range image sensor 32 for each pixel signal, that is, for each pixel circuit 321.

Now, a method of calculating a distance between the range image pickup device 1 and a subject S which is performed by the distance calculator 42 will be described. Here, a quantity of electric charge which is distributed to the charge storage portion CS1 of the pixel signal reading portion RU1 and which corresponds to background light before an optical pulse PO is applied is defined as a charge quantity Q1. A quantity of electric charge which is distributed to the charge storage portion CS2 of the pixel signal reading portion RU2 and which corresponds to background light and reflected light RL which is incident with a short delay time is defined as a charge quantity Q2. A quantity of electric charge which is distributed to the charge storage portion CS3 of the pixel signal reading portion RU3 and which corresponds to background light and reflected light RL which is incident with a long delay time is defined as a charge quantity Q3. Then, the distance calculator 42 calculates a distance D to the subject S for each pixel circuit 321 using Expression (1).

$$D=(Q3-Q1)/(Q2+Q3-2Q1) \times Dm \qquad (1)$$

In Expression (1), Dm is a maximum distance which can be measured (a maximum measurable distance) by application of an optical pulse PO. Here, the maximum measurable distance Dm is expressed by Expression (2). In Expression (2), c is the light speed and Tw is the pulse width of the optical pulse PO.

$$Dm=(c/2)Tw \qquad (2)$$

As described above, the range image pickup device 1 calculates the distance D between the range image pickup device 1 and the subject S for each of the pixel circuits 321 arranged in the light receiving pixel 320 of the range image sensor 32.

As described above, the configuration of the pixel circuits arranged in a grid shape in the range image sensor 32 is not limited to the configuration including three pixel signal reading portions RU1, RU2, and RU3 illustrated in FIG. 3, and each pixel circuit 321 has only to be a pixel circuit 321 with a configuration including one photoelectric conversion element PD and two or more pixel signal reading portions RU to which electric charge generated and stored in the photoelectric conversion element PD is distributed. In this case, in a range image sensor in which pixels including different numbers of pixel signal reading portions RU are arranged, the pixel driving (controlling) method (timing) can be easily realized on the basis of the same idea as the method (timing) of driving (controlling) the pixel circuit 321 in the range image pickup device 1 illustrated in FIG. 4. More specifically, similarly to the range image sensor 32, electric charge corresponding to the corresponding light can be stored (integrated) in the charge storage portions CS of the pixel signal reading portions RU by repeatedly performing charge distribution driving on the pixels with a cycle in which a phase relationship is maintained such that phases of the drive signals input to the reading gate transistors G or the drain gate transistors GD of the pixel signal reading portions RU do not overlap each other. Similarly to the range image sensor 32, the pixel signals of one frame can be output to the outside of the range image sensor by sequentially outputting the voltage signals from all the pixels through the pixel signal reading driving. Accordingly, the distance calculator 42 can similarly calculate the distance D between the range image pickup device 1 and the subject S for each pixel signal (for each pixel) on the basis of the pixel signals of one frame output from the range image sensor in which the pixels including different numbers of pixel signal reading portions RU are arranged.

First Embodiment

In general, a range image sensor drives all the pixel circuits 321 in the light receiving pixel 320 at the same timing in a storage period on the basis of the global shutter system to accurately measure a distance to a subject. That is, the storage drive signal TX1, TX2, and TX3 and the reset drive signal RSTD are supplied to all the pixel circuits 321 arranged in a grid shape at the same timing.

Accordingly, for example, in order to set the gates of the reading gate transistors G1 of all the pixel circuits 321 in the light receiving pixel 320 to the "H" level at the same timing, a peak current increases transiently greatly. Due to the transient increase of the peak current, the aforementioned ringing occurs and electric charge cannot be accurately read from the pixel circuits 321. The aforementioned problem also occurs when other storage drive signal TX1, TX2, and TX3 and the reset drive signal RSTD are supplied to the pixel circuits 321.

In order to solve this problem, in this embodiment, the timing at which the peak current is increased is delayed by driving the reading gate transistors G1, G2, and G3 and the drain gate transistor GD in the pixel circuits 321 by columns of the pixel circuits 321, and thus the peak current which is generated can be dispersed to curb occurrence of the ringing.

That is, in this embodiment, a clock signal CK is supplied to the timing adjustment circuit 326C_j at the center of the timing adjuster 326C, the clock signal CK is sequentially delayed by a predetermined adjustment time Tcd from the center by columns of the pixel circuits 321, and the pixel circuits 321 are driven by columns using the drive signals.

Figure 5:
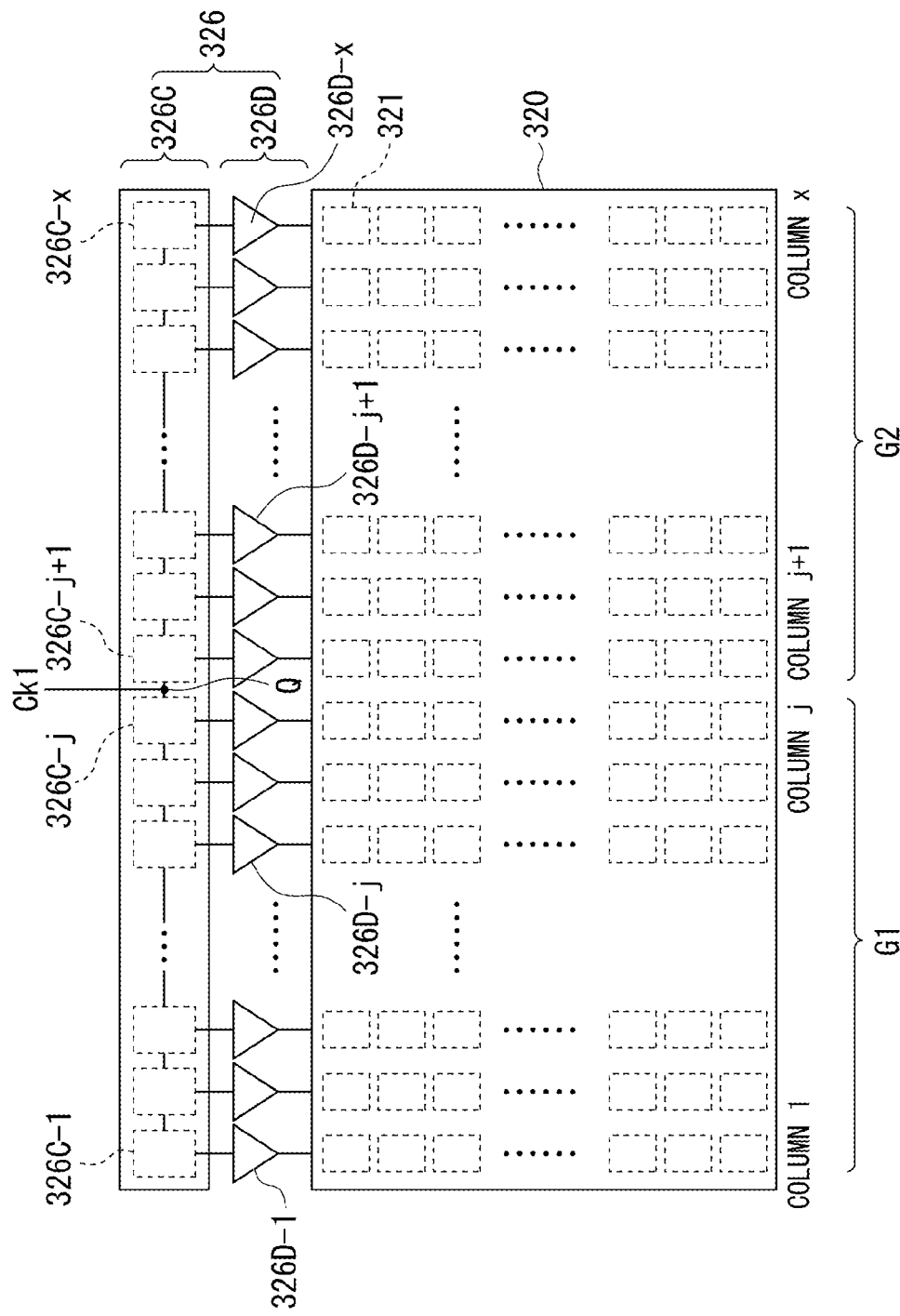
FIG. 5 is a diagram illustrating an example of a configuration of a pixel drive circuit 326 that drives pixel circuits 321 in units of columns in the pixel circuits 321 which are arranged in a grid shape in a light receiving pixel 320 according to a first embodiment.

FIG. 5 is a diagram illustrating an example of the configuration of the pixel drive circuit 326 that drives the pixel circuits 321 by columns in the pixel circuits 321 which are arranged in a grid shape in the light receiving pixel 320 according to this embodiment. The pixel drive circuit 326 includes a timing adjuster 326C and a driver 326D. The timing adjuster 326C includes timing adjustment circuits 326C_j (1≤j≤x) which are provided for each column of the pixel circuits 321 (x columns, where x is an integer equal to or greater than 1). The driver 326D includes driver circuits 326D_j (1≤j≤x) which are provided for each column of the pixel circuits 321 similarly to the timing adjuster 326C. In the following description, one column of the pixel circuits 321 out of the pixel circuits 321 arranged in a grid shape is defined as Column j. The timing adjustment circuit corresponding to Column j is defined as a timing adjustment circuit 326C_j and the driver circuit corresponding thereto is defined as a driver circuit 326D_j.

In FIG. 5, a group of the timing adjustment circuit 326C_j and the driver circuit 326D_j is provided for each column of the pixel circuits 321. Actually, storage drive signals TX1, TX2, and TX3 and a reset drive signal RSTD are supplied to each pixel circuit 321. Accordingly, a group of four timing adjustment circuits 326C_j and four driver circuits 326D_j for supplying the storage drive signals TX1, TX2, and TX3 and the reset drive signal RSTD is provided for each column of the pixel circuits 321.

Figure 6:
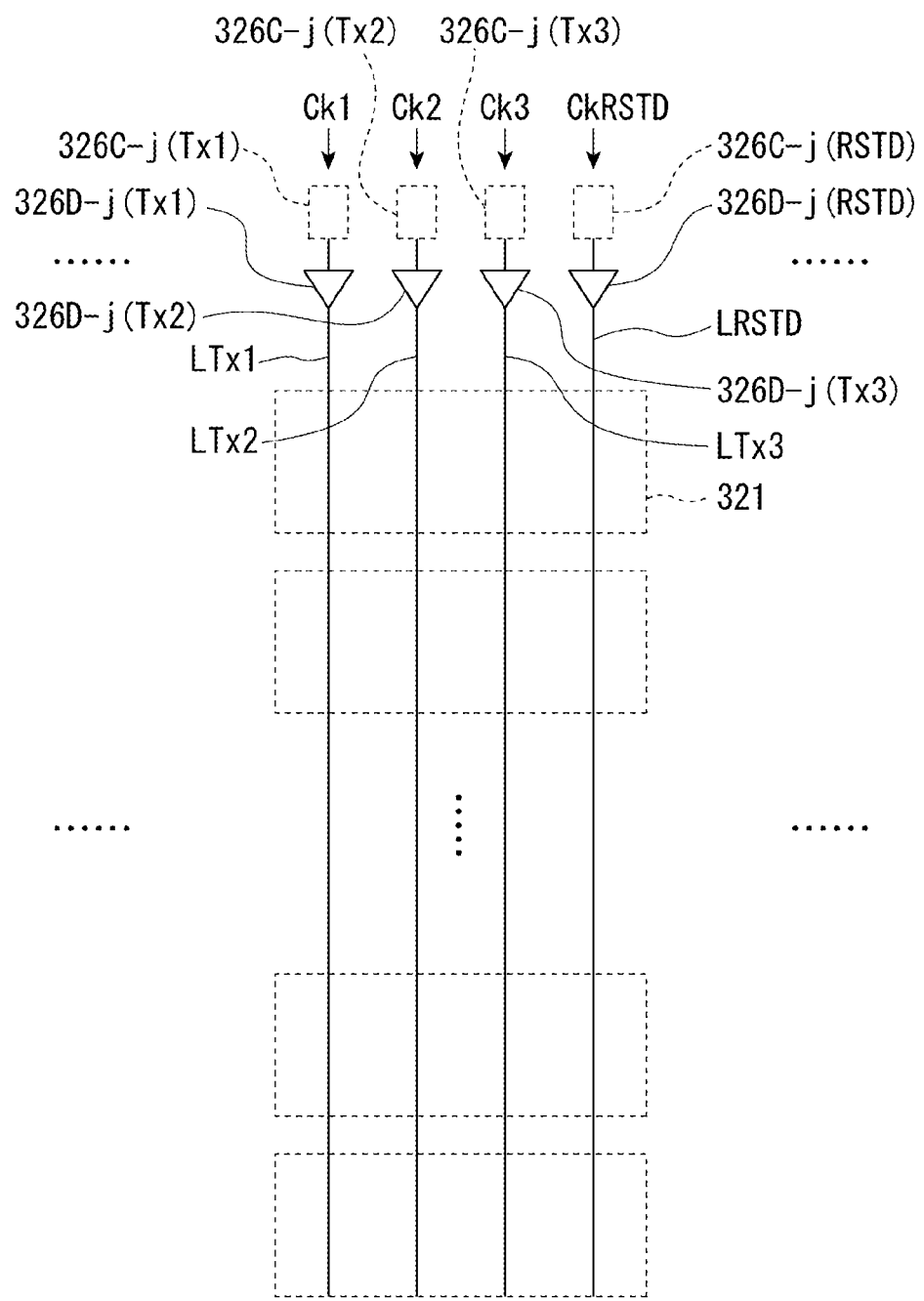
FIG. 6 is a diagram illustrating a configuration for supplying storage drive signals TX1, TX2, and TX3 and a reset drive signal RSTD to the pixel circuits 321 of Column j.

FIG. 6 is a diagram illustrating a configuration for supplying the storage drive signals TX1, TX2, and TX3 and the reset drive signal RSTD to the pixel circuits 321 in Column j.

In FIG. 6, the pixel drive circuit 326 is provided with the timing adjuster 326C including timing adjustment circuits 326Cj(TX1), 326Cj(TX2), 326Cj(TX3), 326C_j(RSTD) and the driver 326D including driver circuits 326D_j(TX1), 326D_j(TX2), 326D_j(TX3), and 326D_j(RSTD) for each column j of the pixel circuits 321.

The driver circuit 326D_j(TX1) outputs the storage drive signal TX1 to a signal line LTX1 when a clock signal CK1 of which the timing has been adjusted (delayed) by the timing adjustment circuit 326Cj(TX1) is input.

The driver circuit 326D_j(TX2) outputs the storage drive signal TX2 to a signal line LTX2 when a clock signal CK2 of which the timing has been adjusted (delayed) by the timing adjustment circuit 326Cj(TX2) is input.

The driver circuit 326D_j(TX3) outputs the storage drive signal TX3 to a signal line LTX3 when a clock signal CK3 of which the timing has been adjusted (delayed) by the timing adjustment circuit 326Cj(TX3) is input.

The driver circuit 326D_j(RSTD) outputs the storage drive signal RSTD to a signal line LRSTD when a clock signal CKRSTD of which the timing has been adjusted (delayed) by the timing adjustment circuit 326C_j(RSTD) is input.

Accordingly, the signal line LTX1 is connected to the gate of the reading gate transistor G1 in each of the pixel circuits 321 of each column j and causes the storage drive signal TX1 to propagate to the gate of the reading gate transistor G1.

Similarly, the signal line LTX2 is connected to the gate of the reading gate transistor G2 in each of the pixel circuits 321 of each column j and causes the storage drive signal TX2 to propagate to the gate of the reading gate transistor G2.

The signal line LTX3 is connected to the gate of the reading gate transistor G3 in each of the pixel circuits 321 of each column j and causes the storage drive signal TX3 to propagate to the gate of the reading gate transistor G3.

The signal line LRSTD is connected to the gate of the drain gate transistor GD in each of the pixel circuits 321 of each column j and causes the storage drive signal RSTD to propagate to the gate of the drain gate transistor GD.

As described above with reference to FIG. 4, the pixel drive circuit 326 includes the timing adjuster 326C including four timing adjustment circuits 326C_j and the driver 326D including four driver circuits 326D_j to correspond to each column j of the pixel circuits 321.

However, for the purpose of simplification of description, only the configuration of the storage drive signal TX1 is illustrated as a representative of the drive signals supplied to a pixel circuit 321 by the pixel drive circuit 326 in FIG. 5. Accordingly, in FIG. 5, the timing adjustment circuit 326C_j (TX1) is illustrated as a timing adjustment circuit 326C_j, and the driver circuit 326D_j(TX1) is illustrated as a driver circuit 326D_j. A timing adjusting operation of delaying the clock signal CK1 by the adjustment time Tcd and an operation of outputting the storage drive signal TX1 when the clock signal CK1 is input will be described below.

The same operations are performed for the other storage drive signals TX2 and TX3 and the reset drive signal RSTD using the same circuits as for the storage drive signal TX2 which will be described below.

As illustrated in FIG. 5, in this embodiment, the x columns of the pixel circuits 321 are divided at the center thereof to generate a first group including Columns 1 to j and a second group including Columns j+1 to x. The clock signal CK1 is supplied to the boundary between the first group and the second group, that is, the timing adjustment circuit 326C_j and the timing adjustment circuit 326C_j+1. Accordingly, in the first group, the clock signal CK1 is sequentially delayed by the adjustment time Tcd from the timing adjustment circuit 326C_j to the timing adjustment circuits 326C_j−1, 326C_j−2, . . . , 326C_1 and is supplied to the driver circuit 326D_j, D_j−1, D_j−2, . . . 326D_1 by propagation. That is, the clock signal propagates to the timing adjustment circuit 326C_j with a delay of an adjustment time Tcd, propagates to the timing adjustment circuit 326C_j−1 with a delay of an adjustment time Tcd×2, propagates to the timing adjustment circuit 326C_j−2 with a delay of an adjustment time Tcd×3, and propagates to the timing adjustment circuit 326C_1 with a delay of an adjustment time Tcd×(x/2).

Similarly, in the second group, the clock signal CK1 is sequentially delayed by the adjustment time Tcd from the timing adjustment circuit 326C_j+1 to the timing adjustment circuits 326C_j+2, 326C_j+3, . . . , 326C_x and is supplied to the driver circuit 326D_j+1, 326D_j+2, 326D_j+3, 326D_x by propagation. That is, the clock signal propagates to the timing adjustment circuit 326C_j+1 with a delay of an adjustment time Tcd, propagates to the timing adjustment circuit 326C_j+2 with a delay of an adjustment time Tcd×2, propagates to the timing adjustment circuit 326C_j+3 with a delay of an adjustment time Tcd×3, and propagates to the timing adjustment circuit 326C_1 with a delay of an adjustment time Tcd×(x/2).

Accordingly, the peak current flows simultaneously in only two driver circuits such as a group of the driver circuits D_j and D_j+1 and a group of the driver circuits D_j−1 and D_j+2, and the peak current is dispersed in the units of the delay time Tcd and is averaged as a predetermined peak current value.

As described above, according to this embodiment, the peak current can be decreased to (x/2) in comparison with a case in which the pixel circuits 321 of the light receiving pixel 320 are simultaneously driven. Accordingly, according to this embodiment, even when the number of pixel circuits 321 (the number of pixels) in the light receiving pixel 320 increases, it is possible to curb a sudden decrease in source voltage due to the peak current without suddenly increasing the peak current which is generated at the time of driving of the pixel circuits 321. As a result, it is possible to prevent occurrence of ringing of the source voltage in the range image pickup device 1 and to accurately read a voltage corresponding to a quantity of stored electric charge from the pixel circuits 321. Even when the number of pixels increases, measurement accuracy of the distance between the subject S in the measuring space P and the range image pickup device 1 is not decreased in comparison with a case in which the number of pixels is small.

At this time, in order to accurately calculate measurement accuracy of a distance, the delay time Tcd needs to have a known numerical value and the timing adjustment circuits 326C_j need to have the same adjustment time Tcd. Since the clock signal propagates with a delay of the adjustment time Tcd by the columns of the pixel circuits 321 in the light receiving pixel 320, the reading timings from the charge storage portions CS are delayed by the adjustment time Tcd. Accordingly, for example, when the storage drive signal TX1 is delayed by the adjustment time Tcd, reception of light is performed in the charge storage portions CS1 of the column of the pixel circuits 321 which is supplied with the storage drive signal TX1 from the driver circuit 326D_j−1 (326D_j+2) at the timing shifted by the adjustment time Tcd in comparison with the column of the pixel circuits 321 which is supplied with the storage drive signal TX1 from the driver circuit 326D_j(326D_j+1).

By also performing the aforementioned process on the other storage drive signals TX2 and TX3 and the reset drive signal RSTD and performing correction of a distance corresponding to the adjustment time Tcd by which the timing (time) at which electric charge generated by the photoelectric conversion element PD due to reception of light is stored is shifted on each pixel signal of one frame, it is possible to measure the distance between the subject S and the range image pickup device 1 in the pixel circuits 321 with high accuracy.

Figure 7:
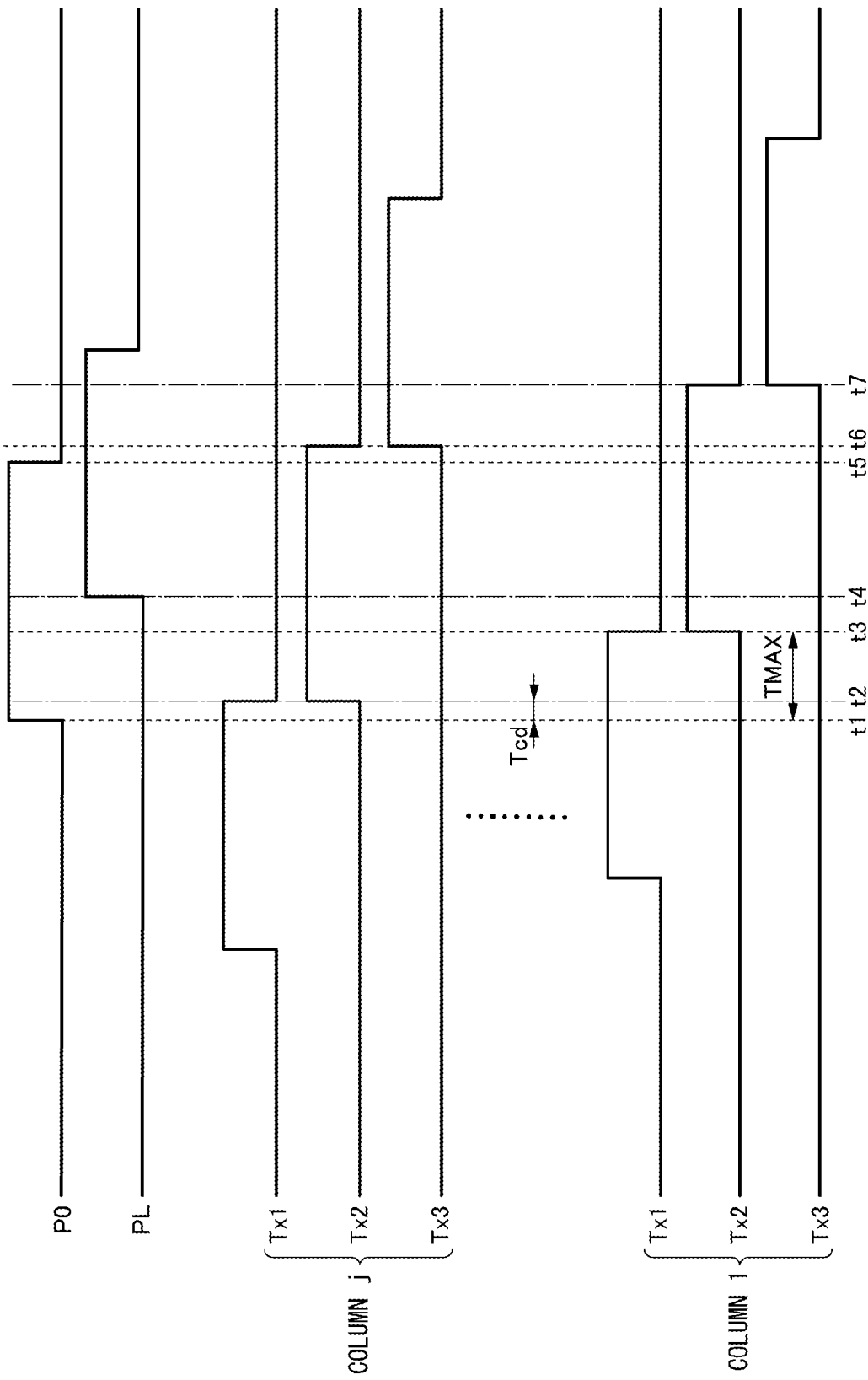
FIG. 7 is a timing chart illustrating the storage drive signals TX1, TX2, and TX3 of which timings have been adjusted using an adjustment time Tcd in the columns of the pixel circuits 321.

FIG. 7 is a timing chart illustrating the storage drive signals TX1, TX2, and TX3 of which the timings have been adjusted with the adjustment time Tcd in the columns of the pixel circuits 321. For the purpose of simplification of description, the reset drive signal RSTD is not illustrated.

As described above with reference to FIG. 5, four groups including the timing adjustment circuit 326C_j and the driver circuit 326D_j are provided for each column of the pixel circuits 321 to correspond to the storage drive signals TX1, TX2, and TX3 and the reset drive signal RSTD. That is, a group including the timing adjustment circuit 326C_j (TX1) and the driver circuit 326D_j(TX1) is provided to correspond to the storage drive signal TX1. Similarly, a group including the timing adjustment circuit 326C_j(TX2) and the driver circuit 326D_j(TX2) is provided to correspond to the storage drive signal TX2. A group including the timing adjustment circuit 326C_j(TX3) and he driver circuit 326D_j(TX3) is provided to correspond to the storage drive signal TX3. A group including the timing adjustment circuit 326C_j(RSTD) and the driver circuit 326D_j(RSTD) is provided to correspond to the reset drive signal RSTD.

In the following description, the timing adjustment circuits 326C_1(TX1), 326C_1(TX2), and 326C_1(TX3) and the driver circuits 326D_1(TX1), 326D_1(TX2), and 326D_1(TX3) supply the storage drive signals TX1, TX2, and TX3 to Column 1 of the pixel circuits 321. The timing adjustment circuits 326C_j(TX1), 326C_j(TX2), and 326C_j(TX3) and the driver circuits 326D_j(TX1), 326D_j (TX2), and 326D_j(TX3) supply the storage drive signals TX1, TX2, and TX3 to Column j of the pixel circuits 321.

In FIG. 7, for example, delay values of the storage drive signals TX1, TX2, and TX3 due to timing adjustment on the clock signals CK1, CK2, and CK3 which propagate from Column j to Column 1 of the pixel circuits 321 in the first group are illustrated.

Adjustment values for timing adjustment using the adjustment time Tcd are illustrated. The storage drive signal TX1 is supplied to the pixel circuits 321 of Column j from the driver circuit 326D_j(TX1) with the clock signal CKRSTD delayed by the timing adjustment circuit 326C_j(TX1) similarly to the storage drive signal TX2 and the storage drive signal TX3 which will be described later.

Application of an optical pulse PO is started at time t1 and application of the optical pulse PO is ended at time t5.

At time t2, the clock signal CK2 is adjusted by the timing adjustment circuit 326C_j(TX2) and is delayed by the adjustment time Tcd than that at time t1, and the storage drive signal TX2 is supplied to the pixel circuits 321 of Column j from the driver circuit 326D_j (TX2).

At time t7, the clock signal CK3 is adjusted by the timing adjustment circuit 326C_j(TX3) and is delayed by the adjustment time Tcd than that at time t1, and the storage drive signal TX3 is supplied to the pixel circuits 321 of Column j from the driver circuit 326D_j(TX2).

Here, when an optical pulse PO is applied at time t1, the clock signal CK2 is supplied to the pixel drive circuit 326 form the control circuit 322 in synchronization with the timing at which the optical pulse PO is applied. Accordingly, the timing at which the clock signal CK2 is supplied to the pixel circuits 321 of Column j is adjusted by the timing adjustment circuit 326C_j(TX2) and the clock signal CK2 propagates to the driver circuit 326D_j(TX2) at time t2 which is delayed by the adjustment time Tcd from time t1.

Accordingly, a period of time in which reflected light PL is received by the charge storage portion CS2 of the pixel circuit 321 is increased by the adjustment time Tcd and electric charge generated by the photoelectric conversion element PD due to the reflected light PL is more stored as much as the adjustment time Tcd.

On the other hand, the timing at which the clock signal CK3 is supplied to the pixel circuits 321 of Column j is adjusted by the timing adjustment circuit 326C_j(TX3) and the clock signal CK3 propagates to the driver circuit 326D_j (TX3) at time t6 which is delayed by the adjustment time Tcd from time t5 at which the optical pulse PO falls.

Accordingly, a period of time in which reflected light PL is received by the charge storage portion CS3 of the pixel circuit 321 is decreased by the adjustment time Tcd and electric charge generated by the photoelectric conversion element PD due to the reflected light PL is less stored as much as the adjustment time Tcd.

As a result, by delaying the storage drive signals TX1 to TX3 by the adjustment time Tcd, the quantity of electric charge stored in the charge storage portion CS2 increases and the quantity of electric charge stored in the charge storage portion CS3 decreases. Accordingly, the distance D which is calculated using Expression (1) and Expression (2) is calculated as a distance which is apparently shorter by the adjustment time Tcd. That is, the distance D is calculated as a distance which is shorter by a distance $(c/2)Tcd$.

Accordingly, the distance calculator 42 calculates a measured distance D by performing correction corresponding to the adjustment time Tcd on the distance D calculated from the distance pixel voltage signals PS1, PS2, and PS3 which are sequentially supplied, that is, adding the distance $(c/2)$ Tcd to the distance D. At this time, the distance calculator 42 calculates a distance as a measurement result by adding a correction distance, which is obtained by multiplying the distance $(c/2)Tcd$ by the number of timing adjustment circuits 326C_j from the position which is supplied with the clock signal to each column, to the distance calculated from the pixel signals of the corresponding column of the pixel circuits 321 arranged in a grid shape.

In this embodiment, the maximum value of the adjustment time Tcd is set as follows because it is apparently calculated as a distance which is shorter than an actual distance.

In FIG. 7, since the clock signals CK (CK1, CK2, CK3) propagate via j (that is, x/2) timing adjustment circuits 326C_j(TX1, TX2, TX3), the total delay time TMAX of the storage drive signals TX1 to TX3 to the pixel circuits 321 of the first column is the adjustment time $Tcd \times (x/2)$ from the timing at which the clock signal CK is input and the correction distance is $Tcd \times (c/2) \times (c/2)$. Accordingly, the distance calculator 42 calculates a result of addition of the correction distance $Tcd \times (c/2) \times (c/2)$ to the distance D calculated from the pixel circuits 321 of the first column as a distance which is a measurement result between the pixel circuit 321 and the subject S.

A measuring range of a distance which is measured by the range image pickup device 1 is set in specifications. In the measuring range, a lower limit of the measuring range changes by adjusting the storage drive signals TX1, TX2, and TX3 using the adjustment time Tcd as described above.

In FIG. 7, when the total delay time TMAX increases and the rising edge of the storage drive signal TX2 for the pixel circuit 321 of the first column is later than time t3, that is, the timing at which reception of reflected light RL from the subject S is started, after time t4, some of electric charge generated due to the reflected light RL from the subject S (electric charge which is generated by the photoelectric conversion element PD in a period of time from time t4 to time t3) cannot be stored in the charge storage portion CS2. Accordingly, it is not possible to accurately measure the distance D between the subject S and the range image pickup device 1.

Accordingly, the total delay time TMAX is $2 \times Dmin/c$, where Dmin represents the lower limit of the measuring range in the specifications. Accordingly, $(2 \times Dmin/c) = Tcd \times (x/2)$ is satisfied and the maximum value of the adjustment time Tcd is less than $4 \times Dmin/(c \times x)$. On the other hand, the minimum value of the adjustment time Tcd is calculated as a time in which the peak current is less than a predetermined numerical value by simulation or experiment.

The delay time Tcd needs to be constant in the timing adjustment circuits 326C_j in order to correct the calculated distance D.

Figure 8:
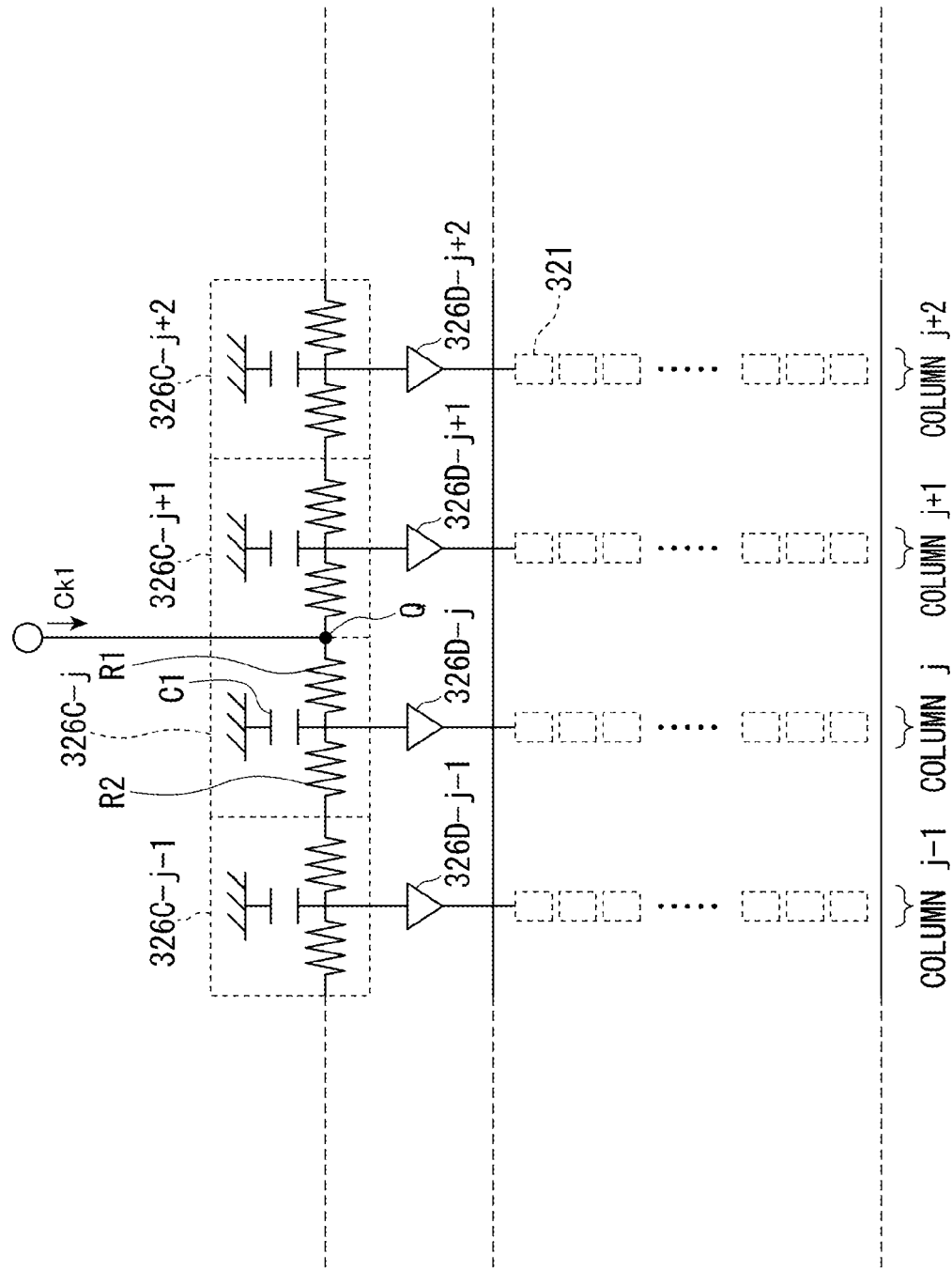
FIG. 8 is a diagram illustrating an example of a configuration of a timing adjustment circuit 326C_j in a timing adjuster 326C according to the embodiment.

FIG. 8 is a diagram illustrating an example of a configuration of the timing adjustment circuit 326C_j in the timing adjuster 326C according to this embodiment. In FIG. 8, the storage drive signal TX1 is illustrated as an example. The same configuration is employed for the other storage drive signals TX2 and TX3 and the reset drive signal RSTD.

The timing adjustment circuit 326C_j includes resistors R1 and R2 and a capacitor C. Here, the resistors R1 and R2 are formed by wiring resistances between the input terminals of the neighboring driver circuits 326D_j. The capacitor C is formed by the wiring capacitance between the input terminals and gate capacitances of MOS transistors which are the input terminals. The resistor R1, the resistor R2, and the capacitor C are formed such that a time constant based on the resistance values of the resistors R1 and R2 and the capacitance value of the capacitor C becomes the adjustment time Tcd. In comparison with a case in which a buffer circuit for a delay is provided, the adjustment times Tcd of the timing adjustment circuit 326Cj(TX1) can be made constant with higher accuracy by using the wiring resistance values and the wiring capacitance values. When a buffer circuit is used as the timing adjustment circuit, the buffer circuit has great process irregularity in manufacturing, the adjustment time Tcd for the driver circuits 326D_j(TX1) cannot be made to be constant, correction in the distance calculator 42 cannot be accurately performed, and an accurate distance between a subject S and the range image pickup device 1 cannot be measured.

Accordingly, in the timing adjuster 326C according to this embodiment, the timing adjustment circuit 326Cj(TX1) including the resistors R1 and R2 and the capacitor C are connected in series. Each of the timing adjustment circuit 326Cj(TX1) connected in series delays the clock signal CK1 by the adjustment time Tcd and causes the clock signal CK1 to propagate to the corresponding driver circuit 326D_j (TX1).

That is, the control circuit 322 supplies the clock signal CK1 to a connection point Q between the timing adjustment circuits 326C_j(TX1) and 326C_j−1(TX1). Accordingly, the timing adjustment circuit 326C_j(TX1) supplies the clock signal CK1 which is delayed by the adjustment time Tcd with respect to the connection point G to the input terminal of the driver circuit 326D_j(TX1). Accordingly, the driver circuit 326D_j(TX1) outputs the storage drive signal TX1 to the pixel circuits 321 of Column J at a timing which is delayed by the adjustment time Tcd with respect to the connection point G.

The timing adjustment circuit 326C_j−1(TX1) supplies the clock signal CK1 which is delayed by the adjustment time Tcd×2 with respect to the connection point G to the input terminal of the driver circuit 326D_j−1(TX1). Accordingly, the driver circuit 326D_j−1(TX1) outputs the storage drive signal TX1 to the pixel circuits 321 of Column J−1 at a timing which is delayed by the adjustment time Tcd×2 with respect to the connection point G.

Similarly, the timing adjustment circuit 326C_j+1(TX1) supplies the clock signal CK1 which is delayed by the adjustment time Tcd with respect to the connection point G to the input terminal of the driver circuit 326D_j+1(TX1). Accordingly, the driver circuit 326D_j+1(TX1) outputs the storage drive signal TX1 to the pixel circuits 321 of Column J+1 at a timing which is delayed by the adjustment time Tcd with respect to the connection point G.

The timing adjustment circuit 326C_j+2(TX1) supplies the clock signal CK1 which is delayed by the adjustment time Tcd×2 with respect to the connection point G to the input terminal of the driver circuit 326D_j+2(TX1). Accordingly, the driver circuit 326D_j+2(TX1) outputs the storage drive signal TX1 to the pixel circuits 321 of Column J+2 at a timing which is delayed by the adjustment time Tcd×2 with respect to the connection point G.

Figure 9:
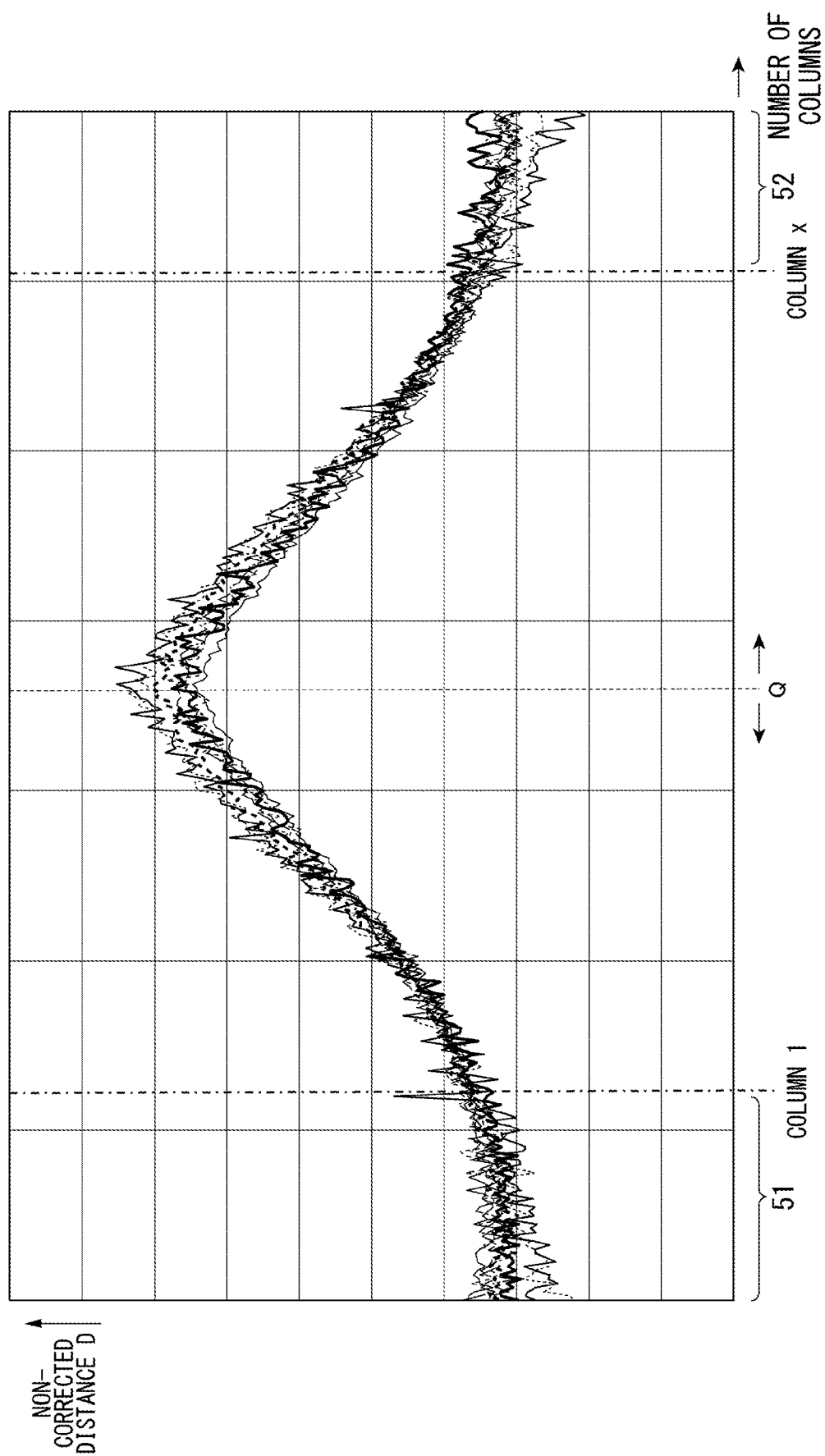
FIG. 9 is a diagram illustrating a correspondence between positions of the columns arranged in a grid shape and a non-corrected distance D calculated using distance pixel voltage signals PS1, PS2, and PS3 of the pixel circuits 321 of the corresponding columns according to the embodiment.

FIG. 9 is a diagram illustrating a correspondence between positions of a column of the pixel circuits arranged in a grid shape and a non-corrected distance D calculated using the distance pixel voltage signals PS1, PS2, and PS3 from the pixel circuits 321 of the column according to this embodiment. In FIG. 9, the vertical axis represents the calculated distance D and the horizontal axis represents the position of the column. Each line in FIG. 9 represents a correspondence between each column and a non-corrected distance D calculated using the distance pixel voltage signals PS1, PS2, and PS3 of the pixel circuits 321 in predetermined rows of the corresponding column.

The distance from the position of the connection point Q to the first column and the distance from the position of the connection point Q to the x-th column change linearly and the delay time Tcd of the timing adjustment circuits 326C_j in each column of the pixel circuits 321 is set as a regular time constant. Accordingly, the distance calculator 42 can calculate the distance between the subject S and the range image pickup device 1 with high accuracy in each pixel circuit 321 by correcting the distance D calculated using the distance pixel voltage signals PS1, PS2, and PS3 from the pixel circuits 321 with the distance corresponding to the existing adjustment time Tcd.

In FIG. 9, an area 51 and an area 52 are areas in which there is no column of the pixel circuits 321, ends of the timing adjustment circuits 326C_j connected in series are open such that the timing adjustment circuits 326C_j from the connection point Q to Column 1 and from the connection point Q to Column x use the same adjustment time Tcd (that is, time constant), and dummy timing adjustment circuits are connected in series to the timing adjustment circuits 326C_1 at the positions of Column 1 and Column x in order to prevent the positional relationship between the calculated distance and the pixel circuits 321 from departing from linearity in Column 1, Column x, and the vicinities of Columns x and 1.

As described above, according to this embodiment, by supplying drive signals (the storage drive signals TX1, TX2, and TX3 and the reset drive signal RSTD) of which the timing has been sequentially delayed in the arrangement direction of the columns to the pixel circuits 321 of the columns out of the pixel circuits 321 arranged in a grid shape, the number of pixel circuits 321 which are driven at the same timing can be decreased. Accordingly, even when the number of pixels (pixel circuits 321) increases, it is possible to limit the peak current to a predetermined value as in the related art. Since the delay time by which the timings are adjusted to be delayed is the existing adjustment time Tcd, the distance calculated using the quantity of electric charge due to reception of light in each column of the pixel circuits 321 arranged in a grid shape can be sequentially corrected with a correction distance corresponding to the adjustment time Tcd and thus it is possible to measure the distance between the range image pickup device 1 and the subject with high accuracy.

Second Embodiment

Figure 10:
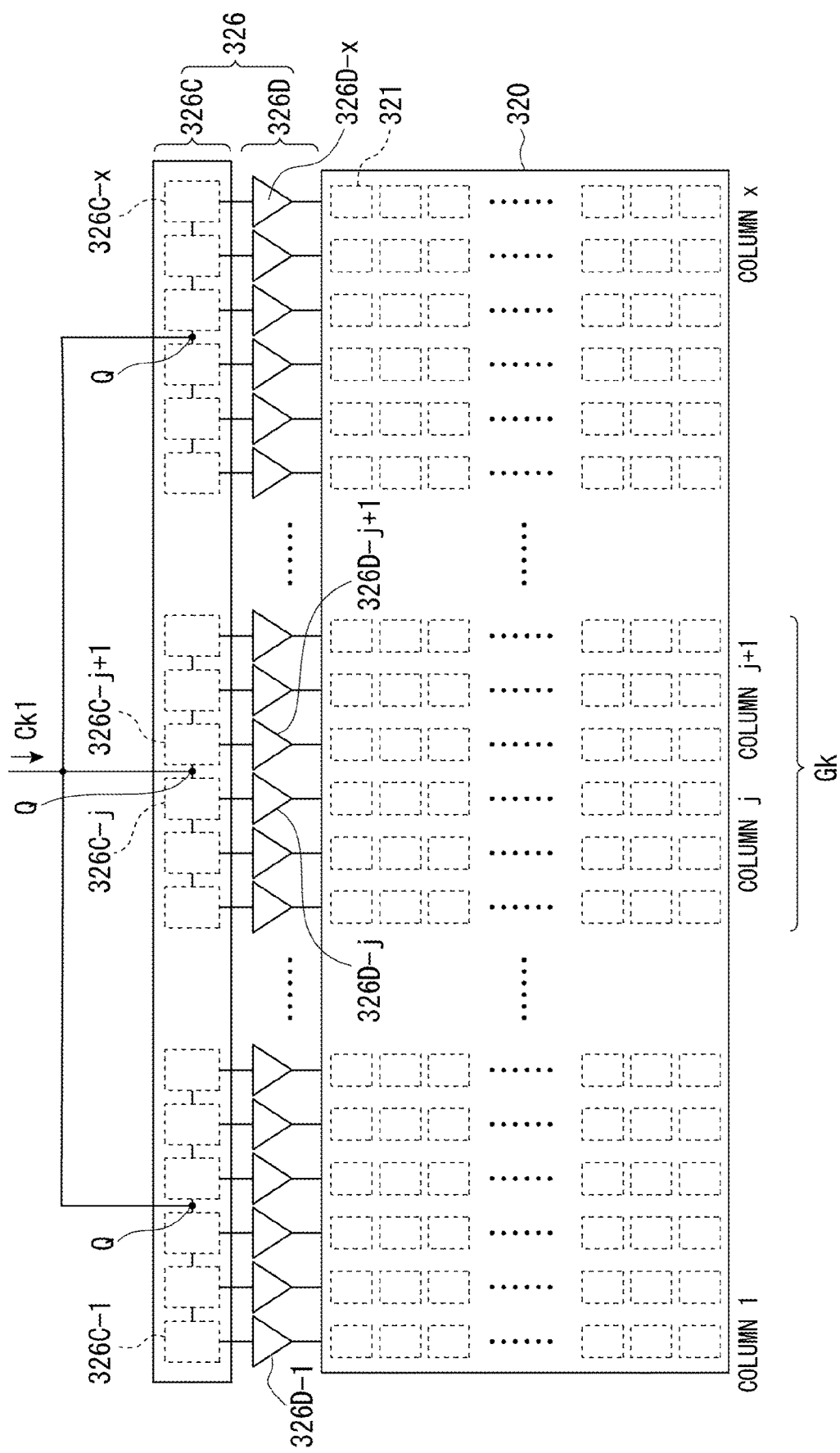
FIG. 10 is a diagram illustrating an example of a configuration of a pixel drive circuit 326 that drives pixel circuits 321 in units of columns in the pixel circuits 321 which are arranged in a grid shape in a light receiving pixel 320 according to a second embodiment.

A second embodiment of the invention will be described below with reference to the accompanying drawings. FIG. 10 is a diagram illustrating an example of a configuration of a pixel drive circuit 326 that drives the pixel circuits 321 in units of columns out of the pixel circuits 321 arranged in a grid shape in a light receiving pixel 320 according to this embodiment. In the configuration according to the first embodiment illustrated in FIG. 5, the groups of the timing adjustment circuits 326C_j and the driver circuits 326D_j in the pixel drive circuits 326 are partitioned into the first group G1 and the second group G2. On the other hand, in this embodiment, the groups of the timing adjustment circuits 326C_j and the driver circuits 326D_j in the pixel drive circuits 326 are partitioned into three or more groups.

In this embodiment, in each group of the timing adjustment circuits 326C_j and the driver circuits 326D_j, a clock signal CK is supplied to a connection point Q at the center of serial connections between the timing adjustment circuits 326C_j which are connected in series in the group.

For example, in a group Gk, the clock signal CK (for example, CK1) is supplied to the connection point Q between the timing adjustment circuits 326C_j and 326C_j+1.

Accordingly, in the embodiment illustrated in FIG. 5, the number of driver circuits 326D_j in which a peak current flows suddenly at the same timing is two, but a peak current flows suddenly in (the number of groups×2) driver circuits 326D_j at the same timing in this embodiment. Accordingly, it is necessary to set the number of groups to the number of driver circuits 326D_j in which the peak current is less than a value at which a source voltage varies and ringing occurs.

With the configuration of the pixel drive circuit 326 illustrated in FIG. 10, when the delay time Tcd is the same, the number of timing adjustment circuits 326C_j which are connected in series in a group decreases and thus the total delay time TMAX illustrated in FIG. 7 is shorter than that in the configuration according to the first embodiment illustrated in FIG. 5.

Accordingly, with the configuration of the pixel drive circuit 326 illustrated in FIG. 10, since the lower limit of the measuring range in the range image pickup device 1 can be decreased, it is possible to substantially broaden the measuring range of the distance to be measured, that is, to accurately measure a distance to a subject S which is located closer, in comparison with the configuration according to the first embodiment as well as to decrease the peak current at the timing at which the pixel circuits 321 are driven and to measure a distance between the range image pickup device 1 and a subject S with high accuracy through correction using an existing correction distance similarly to the first embodiment.

In FIG. 10, in each group of the timing adjustment circuits 326C_j and the driver circuits 326D_j, a clock signal CK is supplied to a connection point Q at the center of serial connections between the timing adjustment circuits 326C_j which are connected in series in the group, but the clock signal CK may be supplied to any connection point or end in serial connections between the timing adjustment circuits 326C_j.

Third Embodiment

Figure 11:
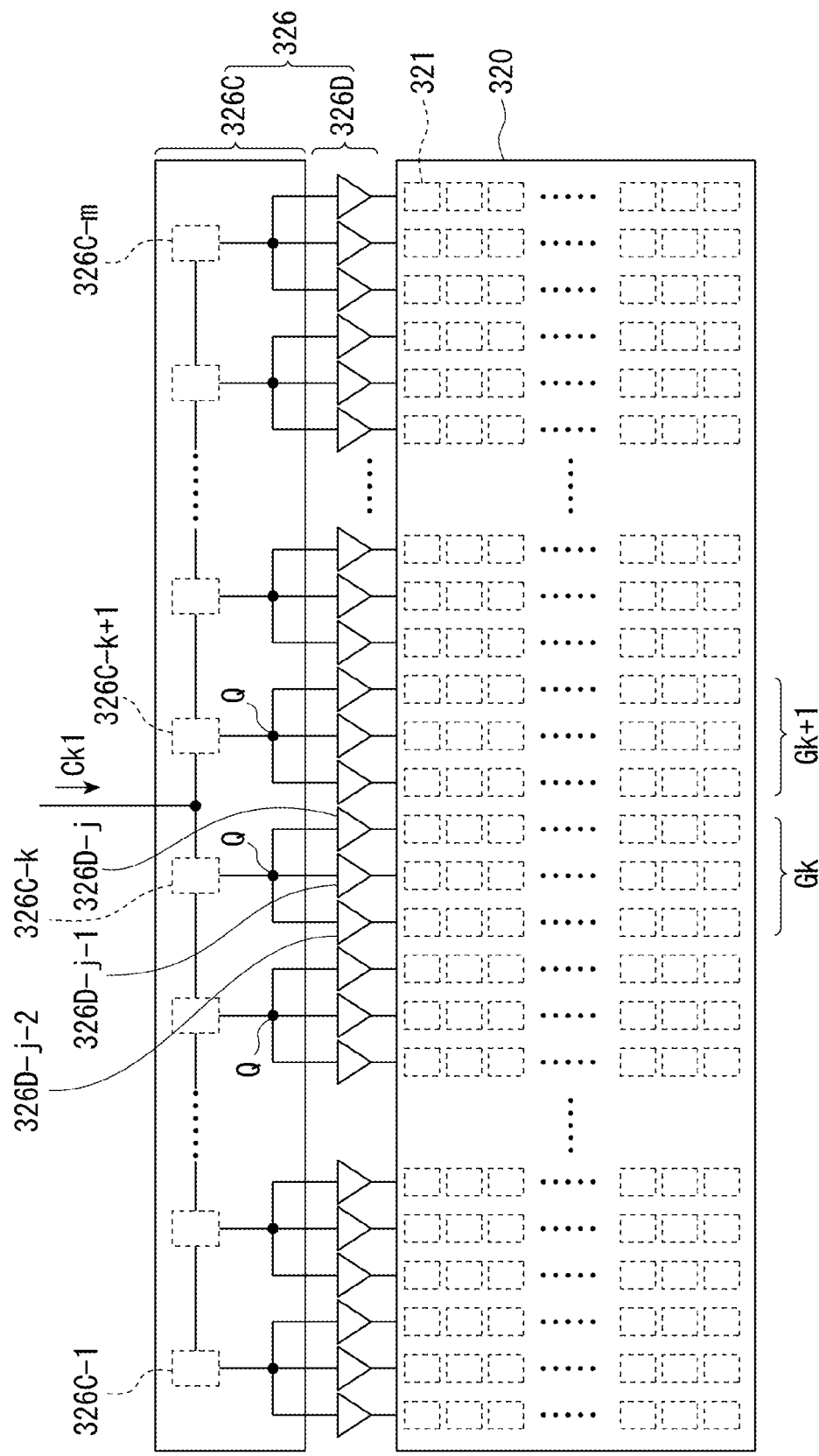
FIG. 11 is a diagram illustrating an example of a configuration of a pixel drive circuit 326 that drives pixel circuits 321 in units of columns in the pixel circuits 321 which are arranged in a grid shape in a light receiving pixel 320 according to a third embodiment.

A third embodiment of the invention will be described below with reference to the accompanying drawings. FIG. 11 is a diagram illustrating an example of a configuration of a pixel drive circuit 326 that drives pixel circuits 321 in units of columns out of the pixel circuits 321 arranged in a grid shape in a light receiving pixel 320 according to this embodiment.

In this embodiment, the driver circuits 326D_j in the driver 326D of the pixel drive circuit 326 are partitioned into a plurality of groups, for example, n groups, and one timing adjustment circuit 326C_n (where n is the number of groups) is provided in each group. Accordingly, the input terminals of the driver circuits 326D_j in each group are commonly connected to a connection point Q and the corresponding timing adjustment circuit 326C_n supplies a clock signal CK to the corresponding driver circuits 326D_j in each group at the same timing. For example, in the case of a group Gk (1≤k≤n), a clock signal CK1 of which the timing has been adjusted and delayed by the timing adjustment circuit 326_k is supplied to the driver circuits 326D_j–2, 326D_j–1, and 326D_j connected to the timing adjustment circuit 326C_k at the same timing.

In the pixel drive circuit 326 with this configuration, the driver circuits 326D_j drive the pixel circuits 321 in the corresponding column j in the units of groups.

Accordingly, in this embodiment, a peak current which is generated in the pixel drive circuit 326 has a numerical value which is obtained by multiplying "2×the number of driver circuits 326D_j in a group" by the peak current of the driver circuit 326D_j at the same timing.

Accordingly, it is necessary to set the number of driver circuits 326D_j in each group such that the peak current is less than a value in which the source voltage varies and ringing occurs.

With the configuration of the pixel drive circuit 326 illustrated in FIG. 11, when the delay time Tcd is the same, the number of timing adjustment circuits 326C_n which are connected in series between the groups and in which the clock signal CK propagates decreases, and thus the total delay time TMAX illustrated in FIG. 7 is shorter than that in the configuration illustrated in FIG. 5.

Accordingly, with the configuration of the pixel drive circuit 326 illustrated in FIG. 11, since the lower limit of the measuring range in the range image pickup device 1 can be decreased similarly to the second embodiment illustrated in FIG. 10, it is possible to substantially broaden the measuring range of the distance to be measured, that is, to accurately measure a distance to a subject S which is located closer, similarly to the second embodiment, in comparison with the configuration according to the first embodiment as well as to decrease the peak current at the timing at which the pixel circuits 321 are driven and to measure the distance between the range image pickup device 1 and the subject S with high accuracy through correction using an existing correction distance similarly to the first embodiment.

Fourth Embodiment

Figure 12:
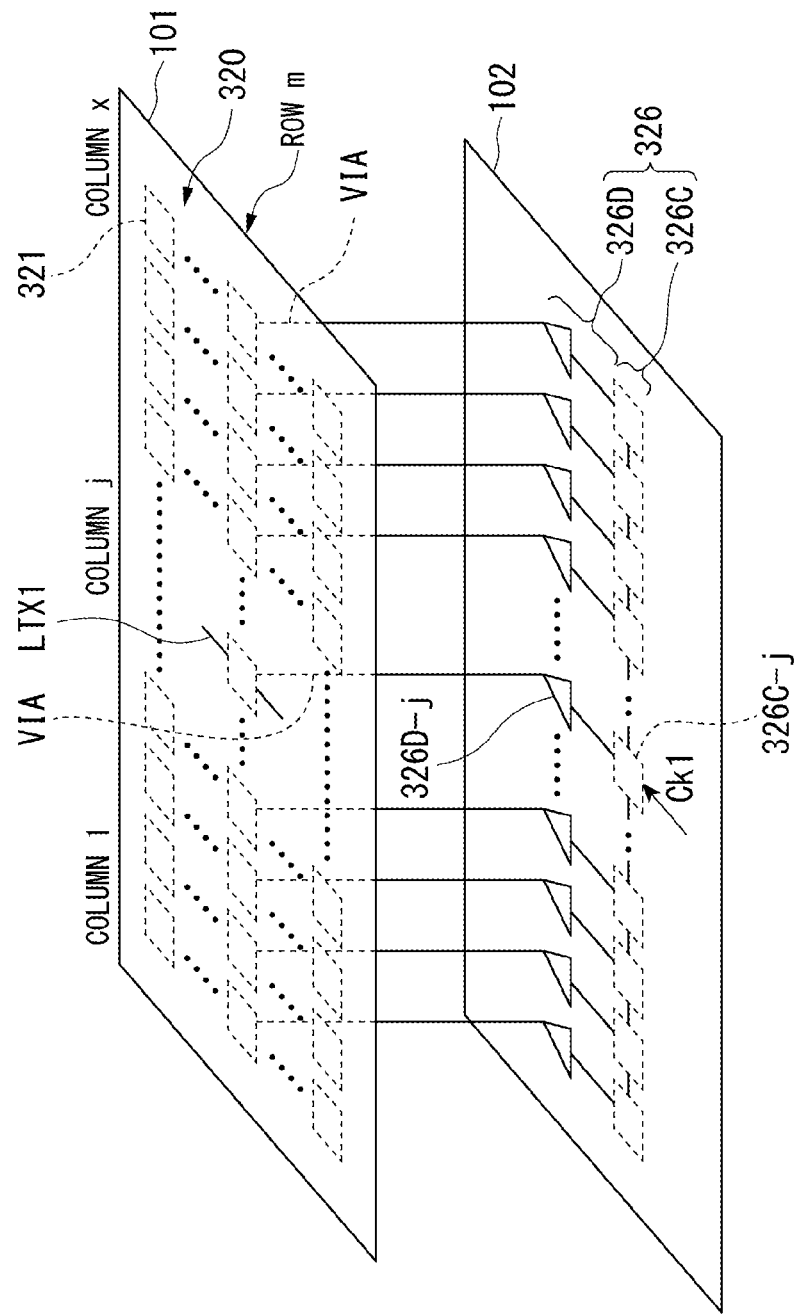
FIG. 12 is a diagram illustrating an example of a configuration of a pixel drive circuit 326 that drives pixel circuits 321 in units of columns in the pixel circuits 321 which are arranged in a grid shape in a light receiving pixel 320 according to a fourth embodiment.

A fourth embodiment of the invention will be described below with reference to the accompanying drawings. FIG. 12 is a diagram illustrating an example of a configuration of a range image pickup device 1 according to this embodiment.

FIG. 12 illustrates a layout of a pixel drive circuit 326 that drives pixel circuits 321 in units of columns out of the pixel circuits 321 arranged in a grid shape in a light receiving pixel 320. The configurations of the timing adjuster 326C and the driver 326D in the pixel drive circuit 326 according to this embodiment are the same as in the first embodiment. Here, the adjustment time Tcd of each timing adjustment circuit 326C_j is set to correspond to the lower limit of a measuring range of a distance similarly to the first embodiment.

In FIG. 12, for example, regarding devices of the range image sensor 32, the light receiving pixel 320 including the pixel circuits 321 is formed on an upper substrate (an upper chip) 101, and the control circuit 322, the vertical scanning circuit 323, the horizontal scanning circuit 324, the pixel signal processing circuit 325, and the pixel drive circuit 326 are formed on a lower substrate (a lower chip) 102. A configuration of a so-called multilayer semiconductor chip in which chips are stacked such as through-silicon via (TSV) can be used to stack the chips.

On the upper substrate 101, the pixel circuits 321 are arranged in a grid shape in the light receiving pixel 320.

On the lower substrate 102, the pixel drive circuit 326 is disposed in parallel to rows of the pixel circuits 321 in the grid-shaped array. Specifically, the timing driver circuits 326D_j in the pixel drive circuit 326 are connected in series at an overlap position or in the vicinity thereof in a plan view which is parallel to a central row m of rows of the pixel circuits 321 in a grid shape in a grid-shaped array of the pixel circuits 321. Similarly to the first embodiment, the gates of the reading gate transistors G1, G2, and G3 and the drain gate transistors GD in the pixel circuits 321 of each column are connected by the same signal lines LTX1, LTX2, LTX4, and LRSTD. For example, a driver circuit 326D_j(TX1) receives an input of a clock signal CK1 supplied from the control circuit 322 via the corresponding timing adjustment circuit 326C_j(TX1) and outputs a storage drive signal TX1. Supply of other storage drive signals TX2 and TX3 and a reset drive signal RSTD are performed using the timing adjustment circuits 326C_j(TX2, TX3, TRSTD) and the driver circuits 326D_j(TX2, TX3, and TRSTD) in the same way as the storage drive signal TX1.

For example, supply of a storage drive signal TX1 to a pixel circuit 321 will be described below as a circuit configuration.

An output terminal of each driver circuit 326D_j(TX1) on the lower substrate 102 is connected to a signal line TX1 at a position of the gate of the reading gate transistor G1 of the pixel circuit 321 disposed in the central row m of the row array in the corresponding column j of the pixel circuits 321 in the grid-shaped array of the pixel circuits 321. Here, the output terminal of the driver circuit 326D_j(TX1) is connected to the signal line LTX1 of the storage drive signal TX1 on the upper substrate 101, for example, via a through-via VIA penetrating the upper substrate 101. The driver circuit 326D_j(TX1) supplies the storage drive signal TX1 to the signal line LTX1 of the storage drive signal TX1 on the upper substrate 101 via the through-via penetrating the upper substrate 101.

Accordingly, in each column of the pixel circuits 321, the storage drive signal TX1 propagates from the pixel circuit 321 at the center of the column to the pixel circuit s 321 at the ends of the column.

The configuration for supplying the other storage drive signals TX2 and TX3 and the reset drive signal RSTD is the same as the configuration for supplying the storage drive signal TX1.

Accordingly, according to this embodiment, it is possible to shorten the total delay time Tmax from the pixel circuit 321 at the position which is supplied with each of the storage drive signals TX1, TX2, and TX3 and the reset drive signal RSTD in each column of the pixel circuits 321 to the pixel circuits 321 at the ends of the column in comparison with the first embodiment, the second embodiment, and the third embodiment in which the storage drive signal propagates from the pixel circuit 321 at one end of each column of the pixel circuits 321 to the pixel circuit 321 at the other end.

Accordingly, according to this embodiment, similarly to the first embodiment, it is possible to decrease a peak current at the timing at which the pixel circuits 321 are driven, to measure a distance between the range image pickup device 1 and a subject S with high accuracy through correction using an existing correction distance, to simply decrease a delay of a delay distribution in the column direction to a half by decreasing the total delay time TMAX, to more approach the timings at which electric charge is stored in the charge storage portions CS1, and to reduce an error of a calculated distance between the pixel circuits 321 of the columns arranged in a grid shape in comparison with the first embodiment.

In this embodiment, the range image sensor 32 according to the first embodiment is configured as a multilayer semiconductor chip including the upper substrate 101 and the lower substrate 102, the light receiving pixel 320 is formed on the upper substrate 101, and the pixel drive circuit 326 is formed on the lower substrate 102. On the other hand, the range image sensor 32 according to the second embodiment or the third embodiment may employ a configuration in which the light receiving pixel 320 is formed on the upper substrate 101 and the pixel drive circuit 326 is formed on the lower substrate 102 similarly to the range image sensor 32 according to the first embodiment.

Fifth Embodiment

Figure 13:
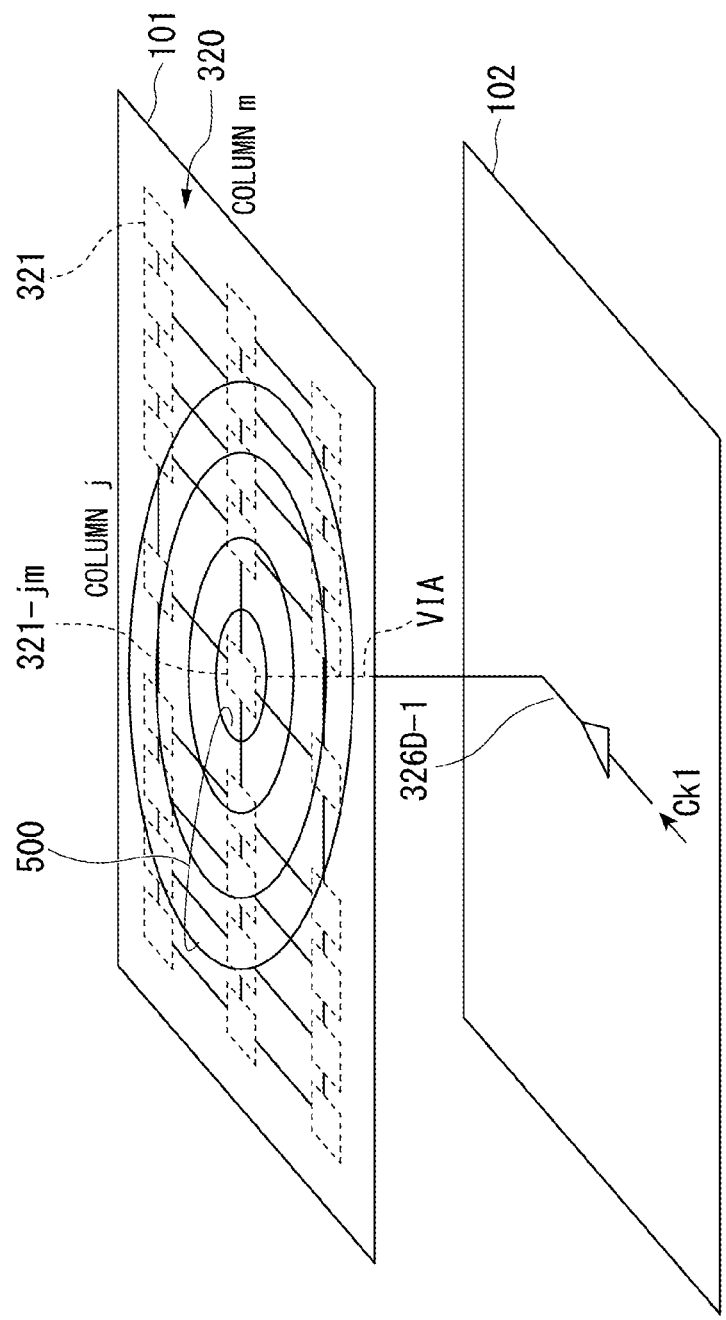
FIG. 13 is a diagram illustrating an example of a configuration of a pixel drive circuit 326 that drives pixel circuits 321 in units of columns in the pixel circuits 321 which are arranged in a grid shape in a light receiving pixel 320 according to the fourth embodiment.

A fifth embodiment of the invention will be described below with reference to the accompanying drawings. FIG. 13 is a diagram illustrating an example of a configuration of a range image pickup device 1 according to this embodiment. In FIG. 13, similarly to the fourth embodiment illustrated in FIG. 12, as devices of the range image sensor 32, a light receiving pixel 320 including pixel circuits 321 arranged in a grid shape is formed on an upper substrate (an upper chip) 101, and a control circuit 322, a vertical scanning circuit 323, a horizontal scanning circuit 324, a pixel signal processing circuit 325, and a pixel drive circuit 326 are formed on a lower substrate (a lower chip) 102. FIG. 13 illustrates the configuration of the pixel drive circuit 326 that drives the pixel circuits 321 in units of columns out of the pixel circuits 321 arranged in a grid shape in the light receiving pixel 320. In the light receiving pixel 320 according to this embodiment, common signal lines LTX1, LTX2, LTX3, and LRSTD are provided for all the pixel circuits 321 unlike the fourth embodiment in which the signal lines LTX1, LTX2, LTX3, and LRSTD are provided for each column of the pixel circuits 321.

Specifically, one driver circuit 326D_1(TX1), 326D_1(TX2), 326D_1(TX3), or 326D_1(RSTD) is provided for each of the storage drive signals TX1, TX2, and TX3 and the reset drive signal RSTD to correspond to all the pixel circuits 321 of the light receiving pixel 320. For example, the driver circuit 326D_1(TX1) receives an input of a clock signal CK1 supplied from the control circuit 322 and supplies the storage drive signal TX1 to all the pixel circuits 321 in the light receiving pixel 320 via the signal line LTX1. That is, the driver circuit 326D_1(TX1) receives the clock signal CK1 supplied from the control circuit 322 and outputs the storage drive signal TX1 to the gates of the reading gate transistors G1 in all the pixel circuits 321 of the light receiving pixel 320.

Supply of the other storage drive signals TX2 and TX3 and the reset drive signal RSTD to the pixel circuits 321 from the driver circuits 326D_1(TX2), 326D_1(TX3), and 326D_1(RSTD) is the same as supply of the storage drive signal TX1 to the pixel circuits 321 from the driver circuit 326D_1(TX1).

The driver circuit 326D_1 in the pixel drive circuit 326 is disposed and formed at an overlap position in a plan view or in the vicinity of the position in the pixel circuit 321 at the center of the grid-shape array of the pixel circuits 321, that is, the pixel circuit 321_jm of the central row m of the central column j in the array. The gates of the reading gate transistors G1, G2, and G3 and the drain gate transistors GD in all the pixel circuits 321 arranged in a grid shape are commonly connected via the same signal lines LTX1, LTX2, LTX3, and LRSTD. That is, the signal lines of the storage drive signals TX1, TX2, and TX3 and the reset drive signal RSTD are commonly connected to all the pixel circuits 321 arranged in a grid shape to form a network of propagation paths. Accordingly, each of the storage drive signals TX1, TX2, and TX3 and the reset drive signal RSTD is supplied at one position of the corresponding signal line, whereby it propagates to all the pixel circuits 321 in the light receiving pixel 320.

For example, supply of the storage drive signal TX1 to the pixel circuits 321 will be described below as a circuit configuration. As described above, the gates of the reading gate transistors G1 in all the pixel circuits 321 arranged in a grid shape are commonly connected by the same signal line. The driver circuit 326D_1(TX1) supplies the storage drive signal TX1 to the signal line LTX1 of the storage drive signal TX1 from the lower substrate 102, for example, via the through-via VIA penetrating the upper substrate 101 at a position at which the signal line of the storage drive signal TX1 is connected to the gate of the reading gate transistor G1 of the pixel circuit 321_jm disposed at the center of the grid-shaped array.

Accordingly, in the pixel circuits 321 arranged in a grid shape, the storage drive signal TX1 sequentially propagates from the pixel circuit 321_jm at the center of the array to the other pixel circuits 321 adjacent thereto in a concentric circle shape 500 with a delay of the adjustment time Tcd. When the storage drive signal TX1 propagates in the concentric circle shape, the signal lines for the pixel circuits 321 are formed such that the adjustment time Td which is a delay time of the storage drive signal TX1 between the neighboring pixel circuits 321 is the same between the neighboring pixel circuits 321.

The same configuration of supplying the storage drive signal TX1 is employed for the other storage drive signals TX2 and TX3 and the reset drive signal RSTD.

Accordingly, in each of the pixel circuits 321 arranged in a grid shape in this embodiment, since the storage drive signals TX1, TX2, and TX3 and the reset drive signal RSTD propagate sequentially to the pixel circuits 321 which are adjacent to the pixel circuit 321 at the center of the grid in the concentric circle shape, compatibility with propagation characteristics of light in the lens 31 and the like in the light receiver 3 of the range image pickup device 1 is excellent. Since electric charge is stored in the charge storage portions CS1, CS2, and CS3 to correspond to the predetermined adjustment time Tcd, it is possible to decrease an error of a distance which is measured, particularly, to decrease an error of a distance which is measured in the pixels in the central area in comparison with the first embodiment, the second embodiment, the third embodiment, and the fourth embodiment.

While embodiments of the invention have been described above in detail with reference to the drawings, a specific configuration of the invention is not limited to the embodiments and includes a design without departing from the gist of the invention.

REFERENCE SIGNS LIST

1 . . . Range image pickup device
2 . . . Light source
3 . . . Light receiver
4 . . . Range image processor
21 . . . Light source device
22 . . . Diffusing film
31 . . . Lens
32 . . . Range image sensor
41 . . . Timing controller
42 . . . Distance calculator
101 . . . Upper substrate
102 . . . Lower substrate
320 . . . Light receiving pixel
321 . . . Pixel circuit
322 . . . Control circuit
323 . . . Vertical scanning circuit
324 . . . Horizontal scanning circuit
325 . . . Pixel signal processing circuit
326 . . . Pixel drive circuit
326C . . . Timing adjuster
326C_j . . . Timing adjustment circuit
326D . . . Driver
326D_j . . . Driver circuit
C . . . Charge storage capacitor
CS . . . Charge storage portion
FD . . . Floating diffusion
G . . . Reading gate transistor
GD . . . Drain gate transistor
0 . . . Output terminal
P . . . Measuring space
PD . . . Photoelectric conversion element
PO . . . Optical pulse
RL . . . Reflected light
RT . . . Reset gate transistor
RU . . . Pixel signal reading portion
S . . . Subject
SF . . . Source follower gate transistor
SL . . . Selection gate transistor
VIA . . . Via

The invention claimed is:

1. A range image pickup device comprising:
a light receiving pixel in which pixel circuits are arranged in a two-dimensional grid shape, each pixel circuit comprising a photoelectric conversion element that receives reflected light which is emitted by a subject in a measuring space which is a space to be measured reflecting optical pulses having a pulse width which matches a pulse width applied to the measuring space from a predetermined light source at intervals of a predetermined cycle and generates electric charge corresponding to the received reflected light and a charge storage portion that stores the electric charge, each pixel circuit storing the electric charge in the charge storage portion in synchronization with application of the optical pulses;
a pixel drive circuit that supplies a storage drive signal for storing the electric charge in the charge storage portion from the photoelectric conversion element to the pixel circuits; and
a range image processor that calculates a distance between the each pixel circuit and the subject which is located in the measuring space based on each of stored charge quantities distributed into charge storage portion of the pixel circuits,
wherein the pixel drive circuit supplies the storage drive signal which is shifted by a predetermined adjustment time between the pixel circuits and stores the electric charge from the photoelectric conversion element in the charge storage portion in each pixel circuit, and
wherein the range image processor corrects a distance calculated for each pixel circuit on the basis of each of the charge quantities of each charge storage portion using a position of the each pixel circuit and the adjustment time and outputs the corrected distance as the distance.

2. The range image pickup device according to claim 1, wherein the adjustment time is set by using a lower limit of a measuring range of the subject in the measuring space, a number of pixel circuits between which the storage drive signal is shifted, and a light speed.

3. The range image pickup device according to claim 1, wherein the charge storage portion comprises a first charge storage portion and a second storage portion, and
wherein the pixel drive circuit sequentially outputs a first storage drive signal and a second storage drive signal with the same pulse width in the cycle as the storage drive signal in synchronization with the application of the optical pulses and distributes and stores electric charge which is generated by the photoelectric conversion element on the basis of a first received light quantity in a period of the first storage drive signal of the reflected light and electric charge which is generated by the photoelectric conversion element on the basis of a second received light quantity in a period of the second storage drive signal of the reflected light to the first charge storage portion and the second charge storage portion to calculate a distance between the range image pickup device and the subject.

4. The range image pickup device according to claim 3, wherein the pixel drive circuit comprises a timing adjustment circuit that performs timing adjustment for shifting a clock signal which is used to generate the storage drive signals by the adjustment time and a driver circuit that receives the clock signal supplied from the timing adjustment circuit and supplies the storage drive signals in correspondence with each column of the pixel circuits in the light receiving pixel, the timing adjustment circuits being connected in series, the timing adjustment circuit at a position corresponding to an input terminal of each driver circuit being supplied with the clock signal for generating the storage drive signal.

5. The range image pickup device according to claim 4, wherein an inter-terminal wiring portion between input terminals of the driver circuit is formed in the timing adjustment circuit such that a time constant based on a wiring capacitance and a wiring resistance of the inter-terminal wiring portion and an input capacitance of the drive circuit becomes the adjustment time.

6. The range image pickup device according to claim 4, wherein the clock signal is supplied to the timing adjustment circuit located at a center of an array of the timing adjustment circuits connected in series.

7. The range image pickup device according to claim 4, wherein columns of the pixel circuits arranged in a grid shape in the light receiving pixel are divided into a predetermined number of blocks, the timing adjustment circuits that supply the clock signal to the drive circuits corresponding to the pixel circuits in each block are connected in series, and the clock signal is supplied to one of the timing adjustment circuits connected in series in the block.

8. The range image pickup device according to claim 4, wherein columns of the pixel circuits arranged in a grid shape in the light receiving pixel are divided into a predetermined number of blocks, input terminals of the drive circuits in each block are connected by a block wire, the timing adjustment circuit is provided for each block wire, the timing adjustment circuits are connected in series, and the clock signal is supplied to one of the timing adjustment circuits connected in series.

9. The range image pickup device according to claim 1, wherein the light receiving pixel is formed in a first layer, the pixel drive circuit is formed in a second layer, and the storage drive signal is supplied to the pixel circuits in the light receiving pixel from the pixel drive circuit via inter-layer wires.

10. The range image pickup device according to claim 9, wherein the pixel drive circuit is formed in the second layer in parallel to a central row of an array of rows of the pixel circuits in the light receiving pixel and the storage drive signal is supplied to the pixel circuits from the pixel drive circuit via the inter-layer wires.

11. The range image pickup device according to claim 3, wherein the light receiving pixel is formed in a first layer and the pixel drive circuit is formed in a second layer,
wherein all input terminals of the pixel circuits arranged in a grid shape in the light receiving pixel are connected via a common signal line and a clock signal for generating the storage drive signal is supplied to the signal line at a position of the pixel circuit located at a center of the grid shape, and
wherein wires between the pixel circuits are formed such that a time constant based on a wiring resistance, a wiring capacitance, and a capacitance of an input terminal of each pixel circuit between all the pixel circuits adjacent to each other becomes the adjustment time.

12. A range image sensor comprising:
a light receiving pixel in which pixel circuits are arranged in a two-dimensional grid shape, each pixel circuit comprising a photoelectric conversion element that receives reflected light which is emitted by a subject in a measuring space which is a space to be measured reflecting optical pulses having a pulse width which matches a pulse width applied to the measuring space from a predetermined light source at intervals of a predetermined cycle and generates electric charge corresponding to the received reflected light and a charge storage portion that stores the electric charge, each pixel circuit storing the electric charge in the charge storage portion in synchronization with application of the optical pulses; and
a pixel drive circuit that supplies a storage drive signal for storing the electric charge in the charge storage portion from the photoelectric conversion element to the pixel circuits,
wherein the pixel drive circuit supplies the storage drive signal which is shifted by a predetermined adjustment time between the pixel circuits and stores the electric charge from the photoelectric conversion element in the charge storage portion in each pixel circuit,
wherein the charge storage portion comprises a first charge storage portion and a second storage portion, and
wherein the pixel drive circuit sequentially outputs a first storage drive signal and a second storage drive signal with the same pulse width in the cycle as the storage drive signal in synchronization with the application of the optical pulses and distributes and stores electric charge which is generated by the photoelectric conversion element based on a first received light quantity in a period of the first storage drive signal of the reflected light and electric charge which is generated by the photoelectric conversion element on the basis of a second received light quantity in a period of the second storage drive signal of the reflected light to the first charge storage portion and the second charge storage portion to calculate a distance between the range image sensor and the subject.

13. A range image sensor comprising:
a light receiving pixel in which pixel circuits are arranged in a two-dimensional grid shape, each pixel circuit comprising a photoelectric conversion element that receives reflected light which is emitted by a subject in a measuring space which is a space to be measured reflecting optical pulses having a pulse width which matches a pulse width applied to the measuring space from a predetermined light source at intervals of a predetermined cycle and generates electric charge corresponding to the received reflected light and a charge storage portion that stores the electric charge, each pixel circuit storing the electric charge in the charge storage portion in synchronization with application of the optical pulses; and
a pixel drive circuit that supplies a storage drive signal for storing the electric charge in the charge storage portion from the photoelectric conversion element to the pixel circuits, wherein the pixel drive circuit supplies the storage drive signal which is shifted by a predetermined adjustment time between the pixel circuits and stores the electric charge from the photoelectric conversion element in the charge storage portion in each pixel circuit, wherein the light receiving pixel is formed in a first layer, the pixel drive circuit is formed in a second layer, and the storage drive signal is supplied to the pixel circuits in the light receiving pixel from the pixel drive circuit via inter-layer wires, and wherein the pixel drive circuit is formed in the second layer in parallel to a central row of an array of rows of the pixel circuits in the light receiving pixel and the storage drive signal is supplied to the pixel circuits from the pixel drive circuit via the inter-layer wires.

* * * * *